United States Patent
Sato et al.

(10) Patent No.: US 9,651,821 B2
(45) Date of Patent: May 16, 2017

(54) SURFACE-MODIFIED METAL OXIDE PARTICLE MATERIAL, DISPERSION LIQUID, SILICONE RESIN COMPOSITION, SILICONE RESIN COMPOSITE BODY, OPTICAL SEMICONDUCTOR LIGHT EMITTING DEVICE, LIGHTING DEVICE, AND LIQUID CRYSTAL IMAGING DEVICE

(71) Applicant: SUMITOMO OSAKA CEMENT CO., LTD., Tokyo (JP)

(72) Inventors: Yoichi Sato, Tokyo (JP); Yasuyuki Kurino, Tokyo (JP); Takeshi Otsuka, Tokyo (JP); Takeru Yamaguchi, Tokyo (JP); Kenji Harada, Tokyo (JP)

(73) Assignee: Sumitomo Osaka Cement Co., Ltd., Tokyo (JP)

( * ) Notice: Subject to any disclaimer, the term of this patent is extended or adjusted under 35 U.S.C. 154(b) by 0 days.

(21) Appl. No.: 14/401,920

(22) PCT Filed: May 20, 2013

(86) PCT No.: PCT/JP2013/063938
§ 371 (c)(1),
(2) Date: Mar. 25, 2015

(87) PCT Pub. No.: WO2013/172476
PCT Pub. Date: Nov. 21, 2013

(65) Prior Publication Data
US 2015/0274894 A1    Oct. 1, 2015

(30) Foreign Application Priority Data

May 18, 2012   (JP) .................................. 2012-114897
Mar. 29, 2013   (JP) .................................. 2013-074730

(Continued)

(51) Int. Cl.
C08G 77/12     (2006.01)
G02F 1/1335    (2006.01)
(Continued)

(52) U.S. Cl.
CPC ........... *G02F 1/1336* (2013.01); *C08G 77/20* (2013.01); *C08G 77/80* (2013.01); *C08K 5/56* (2013.01);
(Continued)

(58) Field of Classification Search
None
See application file for complete search history.

(56) References Cited

U.S. PATENT DOCUMENTS

2008/0042142 A1*   2/2008   Sugawara .............. C08G 77/04
                                                             257/77
2008/0139833 A1    6/2008   Schafer et al.
(Continued)

FOREIGN PATENT DOCUMENTS

JP     2005-200657 A    7/2005
JP     2006-70266 A     3/2006
(Continued)

OTHER PUBLICATIONS

Technical data sheet for p-styryltrimethoxysilane, KBM 1403 from Shin Etsu, 2 pages, 2016.*
(Continued)

*Primary Examiner* — Robert S Loewe
(74) *Attorney, Agent, or Firm* — Renner, Kenner; Arthur M. Reginelli

(57) ABSTRACT

By using a surface-modified metal oxide particle material obtained by performing surface modification on a metal oxide particle having an average primary particle diameter of 3 nm or more and 10 nm or less with a surface-modifying material having at least a phenyl group and a group capable (Continued)

of undergoing a crosslinking reaction with a functional group in a silicone resin-forming component, the surface-modified metal oxide particle material which has high heat resistance and may further exhibit high transparency and gas barrier properties when used for a sealing material for optical semiconductor light emitting device, or the like is provided and a dispersion liquid, a silicone resin composition and a silicone resin composite each containing the surface-modified metal oxide particle material, as well as an optical semiconductor light emitting device, a light fitting, and a liquid crystal imaging device each using the silicone resin composite, are also provided.

9 Claims, 1 Drawing Sheet

(30) Foreign Application Priority Data

May 17, 2013 (JP) ................................. 2013-105419
May 17, 2013 (JP) ................................. 2013-105433

(51) Int. Cl.
| | | |
|---|---|---|
| H01L 33/56 | (2010.01) | |
| C08G 77/20 | (2006.01) | |
| C08K 9/06 | (2006.01) | |
| C08G 77/00 | (2006.01) | |
| C09D 183/04 | (2006.01) | |
| C08K 5/56 | (2006.01) | |
| C08L 83/04 | (2006.01) | |
| C08K 3/22 | (2006.01) | |

(52) U.S. Cl.
CPC ................ C08K 9/06 (2013.01); C08L 83/04 (2013.01); C09D 183/04 (2013.01); H01L 33/56 (2013.01); C08G 77/12 (2013.01); C08K 2003/2244 (2013.01); C08K 2201/008 (2013.01); C08K 2201/011 (2013.01); Y10T 428/2982 (2015.01)

(56) References Cited

U.S. PATENT DOCUMENTS

| | | | | |
|---|---|---|---|---|
| 2009/0140284 A1* | 6/2009 | Kurino | .................. | C08G 83/001 257/100 |
| 2009/0163654 A1* | 6/2009 | Hirano | ................... | C08G 77/18 524/783 |
| 2009/0189510 A1* | 7/2009 | Kanamori | ............ | C09D 143/04 313/498 |
| 2009/0284149 A1* | 11/2009 | Koshikawa | .......... | C08G 65/007 313/512 |
| 2010/0155871 A1* | 6/2010 | Hirano | ..................... | C08L 83/04 257/433 |
| 2010/0213415 A1* | 8/2010 | Fujii | ....................... | B82Y 30/00 252/301.36 |
| 2010/0276721 A1* | 11/2010 | Yoshitake | ............. | C08K 5/5425 257/99 |
| 2011/0105666 A1* | 5/2011 | Okada | ....................... | C08K 9/04 524/408 |
| 2012/0056236 A1* | 3/2012 | Hamamoto | .............. | C08L 83/04 257/100 |
| 2012/0168810 A1* | 7/2012 | Kobayashi | ............... | H01L 33/60 257/99 |
| 2013/0056788 A1 | 3/2013 | Haraguchi et al. | | |
| 2013/0181167 A1* | 7/2013 | Kusunoki | .............. | C08G 77/04 252/301.36 |
| 2014/0021502 A1* | 1/2014 | Shimizu | ................ | H01L 33/501 257/98 |
| 2014/0145226 A1* | 5/2014 | Hohn | .................... | C09D 7/1216 257/98 |
| 2014/0296467 A1* | 10/2014 | Brandstadt | ............. | C08G 77/08 528/15 |

FOREIGN PATENT DOCUMENTS

| | | |
|---|---|---|
| JP | 2007-270004 A | 10/2007 |
| JP | 2008-530258 A | 8/2008 |
| JP | 2009-76948 A | 4/2009 |
| JP | 2010-90008 A | 4/2010 |
| JP | 2010-100784 A | 5/2010 |
| JP | 2010-195646 A | 9/2010 |
| JP | 2011-96793 A | 5/2011 |
| JP | 2011-129901 A | 6/2011 |
| JP | 2011-213506 A | 10/2011 |
| JP | 2011-249768 A | 12/2011 |
| JP | 2012-21117 A | 2/2012 |
| JP | 2012-049505 A | 3/2012 |
| WO | 2011/092647 A2 | 8/2011 |
| WO | 2011-136202 A1 | 11/2011 |

OTHER PUBLICATIONS

Japan Patent Office, Japanese Office Action, Application No. 2013-105419, dated Dec. 13, 2016, 5 pages.

\* cited by examiner

SURFACE-MODIFIED METAL OXIDE PARTICLE MATERIAL, DISPERSION LIQUID, SILICONE RESIN COMPOSITION, SILICONE RESIN COMPOSITE BODY, OPTICAL SEMICONDUCTOR LIGHT EMITTING DEVICE, LIGHTING DEVICE, AND LIQUID CRYSTAL IMAGING DEVICE

TECHNICAL FIELD

The present invention relates to a surface-modified metal oxide particle material, a dispersion liquid, a silicone resin composition, a silicone resin composite, an optical semiconductor light emitting device using this as a sealing material, and a light fitting and a liquid crystal imaging device each including the optical semiconductor light emitting device.

BACKGROUND ART

As described in, for example, Patent Literature 1, silicone resins are excellent in characteristics, such as transparency, heat resistance, light resistance, etc., and also excellent in hardness and rubber elasticity, and therefore, the silicone resins are used in a sealing material for optical semiconductor, an optical waveguide material, and the like.

In particular, as a sealing material of a light emitting diode (LED) that is one of optical semiconductor light emitting elements, there are organic modified silicone resins and phenyl (or methyl phenyl) silicone resins as described in, for example, Patent Literature 2; dimethyl silicone resins as described in, for example, Patent Literature 3; and the like.

Meanwhile, while the silicone resins are excellent in durability, there is involved such a problem that gas permeability is large (gas barrier properties are low), and in response thereto, it has been attempted to incorporate a metal oxide particle. In order to make a transparent composite by using the silicone resin and the metal oxide particle, the particle surface must be treated with an organic silane agent. For example, as described in Patent Literatures 4 and 5, by applying a surface treatment with an epoxy group-containing silane agent or a vinyl group-containing silane agent, it becomes possible to prevent aggregation of the particles at the time of curing of the resin, thereby producing a transparent composite.

PRIOR ART DOCUMENTS

Patent Literature

Patent Literature 1: JP-A 2009-076948
Patent Literature 2: JP-A 2007-270004
Patent Literature 3: JP-A 2011-096793
Patent Literature 4: JP-A 2005-200657
Patent Literature 5: JP-A 2006-70266

SUMMARY OF INVENTION

Technical Problem

But, the silicone resins involve such a problem that the gas permeability is large (gas barrier properties are low), and therefore, by dispersing and combining the metal oxide particle with the silicone resin, it is contemplated to compensate this defect and also to enhance the function. However, there was also involved such a problem that in particular, a sulfur gas in the air corrodes a silver-plated reflector of an LED package (the reflector is sulfurized and blackened), whereby the luminance of LED is lowered.

In addition, in the case of dispersing an inorganic particle in the silicone resin, in a usual surface treatment agent, because of low heat resistance, at high temperatures, particle aggregation is generated (particle dispersibility is lowered), or coloration of the surface treatment agent itself is generated, whereby a transmittance is lowered, and therefore, there was found the case where a problem is caused in the heat resistance.

Furthermore, in the case of performing sealing with a dimethyl silicone resin having low light extraction efficiency from LED, even by increasing sealability of a light bulb structure or applying gold-plating having high anticorrosiveness to a light reflector of the LED package, there were involved such problems that the luminance is low, and that the costs are high.

Meanwhile, though the phenyl (or methyl phenyl) silicone resins are low in gas permeability (gas barrier properties are high) as compared with the dimethyl silicone resins, these characteristics depend upon the amount of a phenyl group which can be introduced, and there was a limit in the introduction amount.

In addition, if an epoxy group is present in the surface treatment agent, or an excess of an unreacted vinyl group remains in the composite, there was encountered such a problem that when a thermal load is applied to the composite, the composite turns yellow. In addition, in the case where consistency between the surface treatment agent and the silicone resin is insufficient, there was encountered such a problem that it cannot be contemplated to enhance the gas barrier properties, or particle aggregation is generated (particle dispersibility is lowered) during thermal loading, whereby the transmittance is lowered.

In order to solve the foregoing problems, the present invention has been made. Specifically, the present invention is aimed to provide a surface-modified metal oxide particle material which when used for a sealing material for optical semiconductor light emitting device, or the like, has high heat resistance (namely, coloration during thermal loading or a lowering of transmittance to be caused due to particle aggregation during thermal loading is suppressed) and may further exhibit high transparency and gas barrier properties; a dispersion liquid, a silicone resin composition and a silicone resin composite each containing the surface-modified metal oxide particle material; an optical semiconductor light emitting device which when the silicone resin composite is used for a sealing material, is capable of lowering gas permeability of the sealing material and suppressing deterioration of the device to be caused due to a permeated gas; and a light fitting and a liquid crystal imaging device each including the optical semiconductor light emitting device.

Solution to Problem

In order to solve the foregoing problems, the present inventors made extensive and intensive investigations. As a result, it has been found that the foregoing problems can be solved by using a surface-modified metal oxide particle material obtained by performing surface modification on a metal oxide particle, an average primary particle diameter of which falls within a prescribed range, with a surface-modifying material having at least a phenyl group and a group capable of undergoing a crosslinking reaction with a functional group in a silicone resin. Specifically, it has been found that by using a silicone resin composite in which this surface-modified metal oxide particle material is contained in a specified silicone resin for a sealing material of a light emitting element in an optical semiconductor light emitting device, it is also possible to more lower the gas permeability of a sealing layer without impairing translucency from the light emitting element, leading to accomplishment of the present invention.

That is, the present invention is as follows.

[1] A surface-modified metal oxide particle material obtained by performing surface modification on a metal oxide particle having an average primary particle diameter of 3 nm or more and 10 nm or less with a surface-modifying material having at least a phenyl group and a group capable of undergoing a crosslinking reaction with a functional group in a silicone resin-forming component.

[2] The surface-modified metal oxide particle material as set forth in [1], wherein the group capable of undergoing a crosslinking reaction with a functional group in a silicone resin-forming component is an alkenyl group.

[3] The surface-modified metal oxide particle material as set forth in [1], wherein the group capable of undergoing a crosslinking reaction with a functional group in a silicone resin-forming component is a hydrogen group.

[4] The surface-modified metal oxide particle material as set forth in [1], wherein the group capable of undergoing a crosslinking reaction with a functional group in a silicone resin-forming component is an alkenyl group and a hydrogen group.

[5] A dispersion liquid including the surface-modified metal oxide particle material as set forth in any one of [1] to [4].

[6] A silicone resin composition including the surface-modified metal oxide particle material as set forth in [1] and a silicone resin-forming component containing at least one member selected from a phenyl silicone resin-forming component and a methyl phenyl silicone resin-forming component, the silicone resin-forming component having a functional group capable of undergoing a crosslinking reaction with a group which the surface-modifying material to be used for the surface-modified metal oxide particle material has.

[7] A silicone resin composition including the surface-modified metal oxide particle material as set forth in [2] and a silicone resin-forming component containing at least one member selected from a phenyl silicone resin-forming component and a methyl phenyl silicone resin-forming component, the silicone resin-forming component having a hydrogen group.

[8] A silicone resin composition including the surface-modified metal oxide particle material as set forth in [3] and a silicone resin-forming component containing at least one member selected from a phenyl silicone resin-forming component and a methyl phenyl silicone resin-forming component, the silicone resin-forming component having at least one member selected from an alkenyl group and an alkynyl group.

[9] A silicone resin composition including the surface-modified metal oxide particle material as set forth in [4] and a silicone resin-forming component containing at least one member selected from a phenyl silicone resin-forming component and a methyl phenyl silicone resin-forming component, the silicone resin-forming component having at least one member selected from an alkenyl group and an alkynyl group and a hydrogen group.

[10] The silicone resin composition as set forth in any one of [6] to [9], wherein the metal oxide particle is contained in an amount of 5% by mass or more.

[11] The silicone resin composition as set forth in any one of [6] to [10], further including a hydrosilylation catalyst.

[12] A silicone resin composite obtained by curing the silicone resin composition as set forth in any one of [6] to [11].

[13] An optical semiconductor light emitting device comprising a semiconductor light emitting element sealed with a sealing material, wherein the sealing material is composed of the silicone resin composite as set forth in [12], and a sealing layer made of the sealing material has a thickness of 50 μm or more.

[14] A light fitting comprising the optical semiconductor light emitting device as set forth in [13].

[15] A liquid crystal imaging device comprising the optical semiconductor light emitting device as set forth in [13].

Advantageous Effects of Invention

According to the present invention, it is possible to provide a surface-modified metal oxide particle material which when used for a sealing material for optical semiconductor light emitting device, or the like, has high heat resistance (namely, coloration during thermal loading or a lowering of transmittance to be caused due to particle aggregation during thermal loading is suppressed) and may further exhibit high transparency and gas barrier properties; a dispersion liquid, a silicone resin composition and a silicone resin composite each containing the surface-modified metal oxide particle material; an optical semiconductor light emitting device which when the silicone resin composite is used for a sealing material, is capable of lowering gas permeability of the sealing material and suppressing deterioration of the device to be caused due to a permeated gas and which is excellent in transparency and heat resistance; and a light fitting and a liquid crystal imaging device each including the optical semiconductor light emitting device.

DESCRIPTION OF EMBODIMENTS

Figure 1:
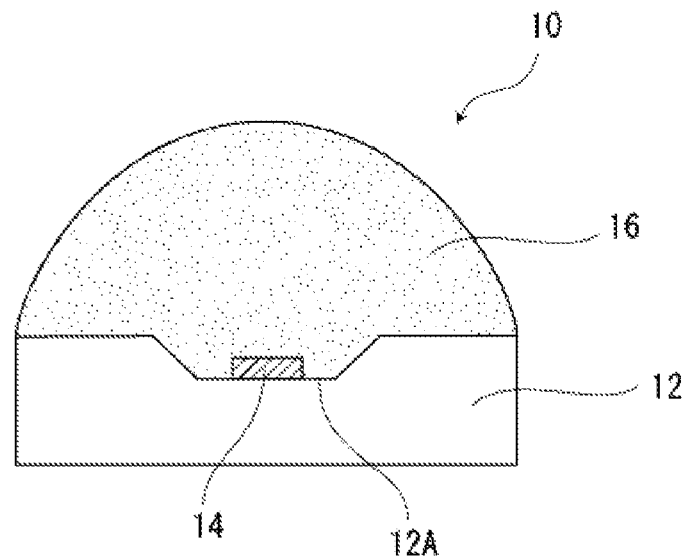
FIG. 1 is a cross-sectional view schematically showing an embodiment of an optical semiconductor light emitting device of the present invention.

The present invention is hereunder described in detail.

[1. Surface-Modified Metal Oxide Particle Material]

The surface-modified metal oxide particle material in the present invention is one obtained by performing surface modification on a metal oxide particle having a specified particle diameter with a surface-modifying material having at least a phenyl group and a group capable of undergoing a crosslinking reaction with a functional group in a silicone resin-forming component. Incidentally, the "silicone resin-forming component" is described later.

(Metal Oxide Particle)

Although the kind of the metal oxide particle is not particularly limited, a kind capable of obtaining a particle diameter of a nanometer size is preferred from the viewpoint of keeping transparency of a sealing material or the like, and examples thereof include zinc oxide, zirconium oxide, titanium oxide, silicon dioxide (silica), aluminum oxide, and the like. In addition, in the case of taking into consideration the matter that a refractive index of the sealing material or the like is increased to enhance light extraction efficiency from an optical semiconductor light emitting device using the sealing material, thereby achieving high luminance, the refractive index of the metal oxide particle is preferably 1.5 or more, more preferably 1.7 or more, and still more preferably 1.9 or more. As such a metal oxide particle, titanium oxide or zirconium oxide (zirconia) is preferred, with zirconia being especially preferred.

Incidentally, when the term "from X to Y" (each of X and Y is an arbitrary numeral) is referred to in the present specification, it means "X or more and Y or less" unless otherwise indicated.

An average primary particle diameter of the metal oxide particle is from 3 to 10 nm. When the average primary particle diameter is less than 3 nm, not only crystallinity is worsened, but also surface activity is strong, and a particle-to-particle interaction is generated, whereby the viscosity of the silicone resin composition increases. Meanwhile, when the average primary particle diameter is more than 10 nm, a difference in refractive index between the metal oxide and the silicone resin containing the surface-modifying material is large so that a lowering of transmittance to be caused due to scattering becomes conspicuous.

The average primary particle diameter is preferably from 4 nm to 8 nm, and more preferably from 4 nm to 6 nm.

(Surface-Modifying Material)

The surface-modifying material which is used for surface modification of the metal oxide particle contains at least a phenyl group and a group capable of undergoing a cross-linking reaction with a functional group in a silicone resin-forming component (hereinafter sometimes referred to as simply "crosslinking reactive group"). The terms "capable of undergoing a crosslinking reaction with a functional group in the silicone resin" as referred to herein mean that during a process of polymerization and curing of a silicone resin-forming component that forms a silicone resin, as described later, it reacts with the functional group contained in the silicone resin-forming component, and after curing, integration of the surface-modified metal oxide particle material with the silicone resin becomes possible. In addition, examples of the above-described crosslinking reaction include a hydrosilylation reaction, a condensation reaction, a reaction of a hydroxyl group with an epoxy group or an isocyanate group, and the like, and examples of the crosslinking reactive group which is subjected to such a crosslinking reaction include a hydrogen group, an alkenyl group, an alkynyl group, a hydroxyl group, an epoxy group, an isocyanate group, and the like.

A hydrosilylation reaction is preferred as the above-described crosslinking reaction from the standpoint that water is not formed as a by-product, or coloration to be caused due to the crosslinking reactive group is suppressed. Examples of the crosslinking reactive group which is subjected to the hydrosilylation reaction include an alkenyl group, an alkynyl group, and a hydrogen group, with an alkenyl group or a hydrogen group being especially preferred.

Incidentally, the "hydrogen group" as referred to in the present invention means hydrogen bound directly to a silicon atom in an organosilicon compound (H in the Si—H bond).

First of all, the case where the crosslinking reactive group of the surface-modifying material is an alkenyl group is described.

In this case, the above-described surface-modifying material may be a surface-modifying material containing both a phenyl group and an alkenyl group in one material, or may be a combination of a surface-modifying material containing a phenyl group and a surface-modifying material containing an alkenyl group.

In addition, for the purpose of uniformly dispersing and stabilizing the surface-modified metal oxide particle material in the silicone resin composite or composition, a surface-modifying material having other structure may also be used in combination.

The reasons why the phenyl group is contained in the surface-modifying material reside in the matters that an interfacial affinity for a phenyl silicone resin and a methyl phenyl silicone resin serving as a matrix (these will be hereinafter sometimes referred to summarizingly as "(methyl) phenyl silicone resin") can be ensured; and that in view of the fact that the surface-modified metal oxide particle and the (methyl) phenyl silicone resin come close to each other due to $\pi$-$\pi$ stacking between the phenyl group of the surface-modifying material and the phenyl group of the (methyl) phenyl silicone resin, a space in the silicone resin composite can be reduced, and the gas permeability can be suppressed.

The reasons why the alkenyl group is contained in the surface-modifying material reside in the matters that during polymerization and curing of the silicone resin composition, the alkenyl group in the surface-modifying material and the hydrogen group in the silicone resin-forming component serving as a matrix (H (hydrogen) bound directly to Si of the siloxane polymer) can be bound to each other due to the crosslinking reaction (hydrosilylation reaction), and phase separation between the surface-modified metal oxide particle material and the matrix silicone resin in the process of polymerization and curing can be prevented from occurring. In addition, this is because when the surface-modified metal oxide particle material and the matrix silicone resin undergo a crosslinking reaction, the surface-modified metal oxide particle material and the matrix silicone resin come close to each other, a space in the silicone resin composite can be reduced, and the gas permeability can be suppressed.

Furthermore, by using the surface-modifying material which is excellent in heat resistance, a lowering of transmittance to be caused due to the generation of particle aggregation at high temperatures (lowering of the particle dispersibility), or the generation of coloration of a surface treatment agent itself, can be suppressed, and therefore, the gas permeability can be suppressed without impairing the heat resistance of the matrix silicone resin. Incidentally, the terms "excellent in heat resistance" as referred to herein mean that the surface-modified structure does not change after a thermal loading test (at 150° C. for 1000 hours) (namely, there is freed from the matter that the surface-modified metal oxide particle material in the resin composition causes aggregation by thermal loading, whereby the dispersibility changes, or the matter that the surface-modifying material in the resin composition or resin composite causes coloration by thermal loading), and the same is also applicable to the following.

Although the surface-modifying material containing a phenyl group is not particularly limited so long as it contains a phenyl group in a structure thereof, examples thereof include materials having a structure represented by the following formula (1) or (2); silicone materials having a resin structure (three-dimensional network structure) containing a phenyl group and an alkoxy group; and the like.

$$(C_6H_5)_n SiX_{4-n} \qquad \text{Formula (1)}$$

(In the formula (1), n is an integer of from 1 to 3. X is selected from a methoxy group, an ethoxy group, a hydroxyl group, a halogen atom, and a carboxy group; and when (4−n) is 2 or more, each X may be the same as or different from every other X.)

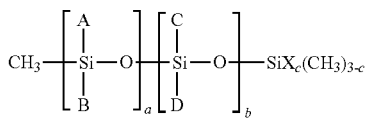

Formula (2)

(In the formula (2), a is an integer of from 1 to 100; b is an integer of from 0 to 100; and c is an integer of from 1 to 3. Each of A, B, C, and D is one or two or more members selected from a phenyl group and an alkyl group having from 1 to 6 carbon atoms, and at least any one of A and B is a phenyl group. All of A, B, C, and D may be a phenyl group. In addition, each of the site constituted of Si.A.B.O and the site constituted of Si.C.D.O is arbitrary with respect to the position and arrangement and is of a random polymer type. X is selected from a methoxy group, an ethoxy group, a hydroxyl group, a halogen atom, and a carboxy group, and when c is 2 or more, each X may be the same as or different from every other X.)

Specifically, examples include phenyl trimethoxysilane, diphenyl dimethoxysilane, a phenyl silicone having an alkoxy introduced into one end thereof, a methyl phenyl silicone having an alkoxy introduced into one end thereof, an alkoxy group-containing phenyl silicone resin, an alkoxy group-containing methyl phenyl silicone resin, and the like. Examples of other phenyl group-containing surface-modifying materials include phenyl group-containing organic acid compounds, such as benzoic acid, methyl benzoate, toluic acid, phthalic acid, etc.

Of these, phenyl trimethoxysilane, diphenyl dimethoxysilane, a phenyl silicone having an alkoxy introduced into one end thereof, a methyl phenyl silicone having an alkoxy introduced into one end thereof, an alkoxy group-containing phenyl silicone resin, and an alkoxy group-containing methyl phenyl silicone resin are preferred from the viewpoint that they are also excellent in heat resistance.

Although the surface-modifying material having an alkenyl group is not particularly limited so long as it contains an alkenyl group in a structure thereof, examples thereof include materials having a structure represented by the following formula (3) or (4); and the like.

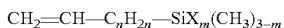 Formula (3)

(In the formula (3), n is an integer of 0 or more; and m is an integer of from 1 to 3. X is selected from a methoxy group, an ethoxy group, a hydroxyl group, a halogen atom, and a carboxy group; and when m is 2 or more, each X may be the same as or different from every other X.)

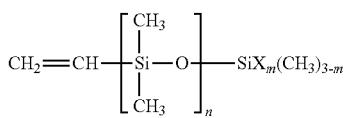

Formula (4)

(In the formula (4), n is an integer of from 1 to 100; and m is an integer of from 1 to 3. X is selected from a methoxy group, an ethoxy group, a hydroxyl group, a halogen atom, and a carboxy group; and when m is 2 or more, each X may be the same as or different from every other X.)

Specifically, examples thereof include vinyltrimethoxysilane and a dimethyl silicone having an alkoxy introduced into one end thereof and having vinyl introduced into the other end thereof. Besides, examples of the surface-modifying material containing an alkenyl group include materials having a structure in which the hydrocarbon chain of the formula (3) is branched, or a structure in which an alkenyl group is contained on the branched hydrocarbon chain; acrylic silane coupling agents, such as methacryloxypropyltrimethoxysilane, acryloxypropyltrimethoxysilane, etc.; carbon-carbon unsaturated bond-containing fatty acids, such as methacrylic acid, etc.; and the like.

Of these, vinyltrimethoxysilane, a dimethyl silicone having an alkoxy introduced into one end thereof and having vinyl introduced into the other end thereof, and materials having a structure in which the hydrocarbon chain of the formula (3) is branched, or a structure in which an alkenyl group is contained on the branched hydrocarbon chain are preferred from the viewpoint that they are also excellent in heat resistance.

Although the surface-modifying material containing both a phenyl group and an alkenyl group is not particularly limited so long as it contains both a phenyl group and an alkenyl group in a structure thereof, examples thereof include styryltrimethoxysilane; a phenyl silicone having an alkoxy introduced into one end thereof and having vinyl introduced into the other end thereof and a methyl phenyl silicone having an alkoxy introduced into one end thereof and having vinyl introduced into the other end thereof, each of which is represented by the formula (5); and the like. These are evenly excellent from the standpoint of heat resistance.

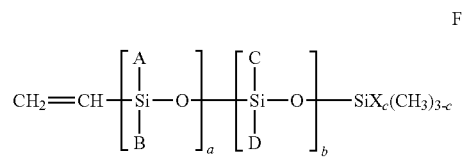

Formula (5)

(In the formula (5), a is an integer of from 1 to 100; b is an integer of from 0 to 100; and c is an integer of from 1 to 3. Each of A, B, C, and D is one or two or more members selected from a phenyl group and an alkyl group having from 1 to 6 carbon atoms, and at least any one of A and B is a phenyl group. All of A, B, C, and D may be a phenyl group. In addition, each of the site constituted of Si.A.B.O and the site constituted of Si.C.D.O is arbitrary with respect to the position and arrangement and is of a random polymer type. X is selected from a methoxy group, an ethoxy group, a hydroxyl group, a halogen atom, and a carboxy group, and when c is 2 or more, each X may be the same as or different from every other X.)

Next, the case where the crosslinking reactive group of the surface-modifying material is a hydrogen group is described. Incidentally, the "hydrogen group" as referred to in the present invention means hydrogen bound directly to a silicon atom in an organosilicon compound (H in the Si—H bond). In addition, there may be the case where the hydrogen group is expressed as "Si—H group".

In this case, the above-described surface-modifying material may be a surface-modifying material containing both a phenyl group and a hydrogen group in one material, or may be a combination of a surface-modifying material containing a phenyl group and a surface-modifying material containing a hydrogen group.

In addition, for the purpose of uniformly dispersing and stabilizing the surface-modified metal oxide particle material in the silicone resin composite or composition, a surface-modifying material having other structure may also be used in combination.

The reasons why the phenyl group is contained in the surface-modifying material are those as described above.

The reasons why the hydrogen group is contained in the surface-modifying material reside in the matters that during polymerization and curing of the silicone resin composition, the hydrogen group in the surface-modifying material and the alkenyl group or alkynyl group in the silicone resin-forming component serving as a matrix can be bound to each other due to the crosslinking reaction (hydrosilylation reaction), and phase separation between the surface-modified metal oxide particle material and the matrix silicone resin in the process of polymerization and curing can be prevented from occurring. In addition, this is because when the surface-modified metal oxide particle material and the matrix silicone resin undergo a crosslinking reaction, the surface-modified metal oxide particle material and the matrix silicone resin come close to each other, a space in the silicone resin composite can be reduced, and the gas permeability can be suppressed. Incidentally, the "resin-forming component" is described later.

By containing a phenyl group and a hydrogen group in the surface-modifying material in this way, consistency between the surface-modifying material and the matrix silicone resin including a (meth) phenyl silicone resin is enhanced to achieve integration, whereby a lowering of transmittance to be caused due to particle aggregation during thermal loading can be suppressed. In addition, since it is not necessary to make an epoxy group or a vinyl group present, a cause itself for coloration during thermal loading can be removed. Furthermore, the phenyl group itself is high in heat resistance. In the light of the above, the surface-modifying material in the present invention has high heat resistance in itself.

Then, in view of the fact that the consistency between the surface-modifying material and the matrix silicone resin is enhanced to achieve integration, the gas barrier properties are also high.

In this way, by using the surface-modifying material having excellent heat resistance, the gas permeability can be suppressed without impairing the heat resistance of the matrix silicone resin.

The surface-modifying material containing a phenyl group is the same as that described above.

Although the surface-modifying material containing a hydrogen group is not particularly limited so long as it contains a hydrogen group (Si—H bond) in a structure thereof, examples thereof include triethoxysilane, dimethylethoxysilane, diethoxymethylsilane, dimethylchlorosilane, ethyldichlorosilane, and the like.

Of these, triethoxysilane, dimethylethoxysilane, and diethoxymethylsilane are preferred from the viewpoint that they are also excellent in heat resistance.

Although the surface-modifying material containing both a phenyl group and a hydrogen group is not particularly limited so long as it contains a phenyl group and a hydrogen group (Si—H bond) in a structure thereof, examples thereof include materials having a structure represented by the following formula (6) or (7); silicone materials having a resin structure (three-dimensional network structure) containing a phenyl group and an alkoxy group and further containing hydrogen bound directly to silicon; and the like.

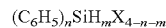  Formula (6)

(In the formula (6), each of n and m is 1 or 2, and a total sum of n and m is 3 or less. X is selected from a methoxy group, an ethoxy group, a hydroxyl group, a halogen atom, and a carboxy group; and when (4 −n−m) is 2 (n=m=1), two Xs may be the same as or different from each other)

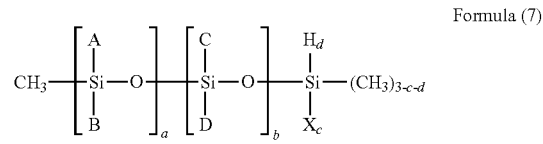  Formula (7)

(In the formula (7), a is an integer of from 1 to 100; and b is an integer of from 0 to 100. Each of A, B, C, and D is one or two or more members selected from a phenyl group, an alkyl group having from 1 to 6 carbon atoms, and a hydrogen group, and at least any one of A and B is a phenyl group. All of A, B, C, and D may be a phenyl group. In addition, each of the site constituted of Si.A.B.O and the site constituted of Si.C.D.O is arbitrary with respect to the position and arrangement and is of a random polymer type. X is selected from a methoxy group, an ethoxy group, a hydroxyl group, a halogen atom, and a carboxy group, and when c is 2 or more, each X may be the same as or different from every other X. When at least one of A, B, C, and D is a hydrogen group, c is an integer of from 1 to 3, d is an integer of from 0 to 2, and a total sum of c and d is 3 or less; and when all of A, B, C, and D do not contain a hydrogen group, each of c and d is 1 or 2, and a total sum of c and d is 3 or less.)

Specifically, examples include phenyldichlorosilane, diphenylchlorosilane, phenylchlorosilane, phenyldiethoxysilane, and the like.

In addition, examples of the surface-modifying material having other structure, which is used in combination for the purpose of uniformly dispersing and stabilizing the metal oxide particle in the silicone resin composition or silicone resin composite as described later, include a dimethyl silicone having an alkoxy introduced into one end thereof, a dimethyl silicone having an alkoxy introduced into one end thereof and having vinyl introduced into the other end thereof, a one-ended epoxy silicone, an alkylsilane compound, a fatty acid compound, and the like.

Next, the case where the crosslinking reactive group of the surface-modifying material is a hydrogen group and an alkenyl group is described.

In this case, the above-described surface-modifying material may be one in which groups of three kinds of a phenyl group, a hydrogen group, and an alkenyl group are contained in one surface-modifying material, may be one in which a material containing groups of two kinds of these three kinds and a material containing a group of the other one type are used in combination, or may be one in which materials individually containing each group of these three kinds are used in combination.

That is, in the present invention, after undergoing the surface modification with a surface-modifying material having at least a phenyl group and an alkenyl group, or at the same time with the surface modification, surface modification with a surface-modifying material having a hydrogen group may be performed. In addition, after undergoing the surface modification with a surface-modifying material having at least a phenyl group and a hydrogen group, or at the same time with the surface modification, surface modification with a surface-modifying material having an alkenyl group (or an alkynyl group) may be performed. According to this, it is possible to modify and carry both a hydrogen group and an alkenyl group (or an alkynyl group) on the surface of the metal oxide particle.

The above-described surface-modifying material having an alkenyl group and surface-modifying material having a hydrogen group are those as described above.

In addition, for the purpose of uniformly dispersing and stabilizing the surface-modified metal oxide particle material in the silicone resin composite or composition, a surface-modifying material having other structure may also be used in combination.

As described previously, during polymerization and curing of the silicone resin composition, the alkenyl group in the surface-modifying material can be bound to and integrated with the hydrogen group in the matrix silicone resin-forming component through a crosslinking reaction (hydrosilylation reaction). In addition, during polymerization and curing of the silicone resin composition, the hydrogen group in the surface-modifying material can be bound to and integrate with the alkenyl group or alkynyl group in the matrix silicone resin-forming component through a crosslinking reaction (hydrosilylation reaction). Then, according to this binding action, not only phase separation between the surface-modified metal oxide particle material and the matrix silicone resin in the process of polymerization and curing can be prevented from occurring, but also by allowing the surface-modified metal oxide particle material and the matrix silicone resin to come close to each other, a space in the silicone resin composite can be reduced, and the gas permeability can be suppressed.

Now, it is preferred to choose an addition curing type for the curing of the matrix silicone resin-forming component as described later. The addition curing as referred to herein means that the hydrogen group arranged in a siloxane polymer in the silicone resin-forming component and the alkenyl group (or the alkynyl group) in the same siloxane polymer undergo polymerization through an addition reaction (hydrosilylation reaction) in the presence of a platinum-group metal-based catalyst, thereby achieving curing. In consequence, the matrix silicone resin-forming component contains at least a silicone resin-forming component containing a hydrogen group and a silicone resin-forming component containing an alkenyl group (or an alkynyl group).

Then, by modifying and carrying an alkenyl group (or an alkynyl group) and a hydrogen group in combination on the surface of the metal oxide particle, not only the alkenyl group on the surface of the metal oxide particle and the hydrogen group in the matrix silicone resin-forming component can undergo a crosslinking reaction, but also the hydrogen group on the surface of the metal oxide particle and the alkenyl group (or the alkynyl group) in the matrix silicone resin-forming component can undergo a crosslinking reaction, and therefore, it is possible to contemplate to integrate the metal oxide particle and the matrix silicone resin with each other.

Incidentally, when the excessive alkenyl group or alkynyl group remains in the silicone resin composite, there is a concern that coloration is generated during thermal loading. In consequence, it is preferred that the alkenyl group and the alkynyl group contained in the silicone resin composition are consumed by a hydrosilylation reaction with the hydrogen group, or the like as far as possible. For this reason, a whole amount of the hydrogen group contained in the silicone resin composition is preferably an amount at which the hydrogen group is able to undergo a hydrosilylation reaction with a total amount of the alkenyl group and the alkynyl group, or more, and more preferably 1.2 times or more thereof (namely, in a state where the hydrogen group is in excess). Incidentally, the "whole amount" as referred to herein means a total sum of the amount in the surface-modifying material and the amount in the matrix silicone rein-forming component.

Examples of a surface modification method with the surface-modifying material on the metal oxide particle include a wet method, a dry method, and the like. Examples of the wet method include a method in which the metal oxide particle and the surface-modifying material and if desired, a catalyst for hydrolyzing the surface-modifying material are put into a solvent, followed by dispersing while undergoing surface modification of the metal oxide particle in the solvent by heating and agitating or applying energy from the outside with bead media or the like. In addition, examples of the dry method include a method of obtaining a surface-modified metal oxide particle while mixing the metal oxide particle and the surface-modifying material by a kneading machine or the like.

A surface modification amount of the above-described surface-modifying material relative to the metal oxide particle ((surface-modifying material)/(metal oxide particle)) is preferably from 5 to 40% by mass. So long as the surface modification amount falls within this range, the dispersibility of the surface-modified metal oxide particle material in the silicone resin as described later can be kept high, and a lowering of transparency or gas permeability can be suppressed.

The above-described surface modification amount is more preferably from 10 to 30% by mass.

Incidentally, the above-described surface modification amount is one obtained by thermally treating the surface-modified metal oxide particle at 750° C. which has been dried at 150° C. and calculating a reduction amount of the mass after the thermal treatment as a mass of the surface-modifying material.

[2. Dispersion Liquid]

The dispersion liquid of the present invention is one obtained by dispersing the above-described surface-modified metal oxide particle material of the present invention in a dispersion medium. According to the dispersion liquid of the present invention, in view of the fact that the surface-modified metal oxide particle material of the present invention is dispersed in a dispersion medium, during combining this with the matrix silicone resin-forming resin component, the surface-modified metal oxide particle material can be dispersed in a uniform and good dispersed state in the matrix silicone resin-forming component, and hence, a silicone resin composition which is excellent in moldability and processability and also excellent in transparency, and a silicone resin composite prepared by further curing the silicone resin composition can be obtained.

A content of the particle material in the dispersion liquid of the present invention is preferably 5% by mass or more and 50% by mass or less. By allowing the content of the particle material to fall within this range, the particle material is able to take a good dispersed state. The content of the particle material is more preferably 10% by mass or more and 30% by mass or less.

The dispersion medium may be a solvent capable of dispersing the particle material therein. Examples of the dispersion medium which is suitably used include water; alcohols, such as methanol, ethanol, 1-propanol, 2-propanol, butanol, octanol, etc.; esters, such as ethyl acetate, butyl acetate, ethyl lactate, propylene glycol monomethyl ether acetate, propylene glycol monoethyl ether acetate, γ-butyl lactone, etc.; ethers, such as diethyl ether, ethylene glycol monomethyl ether (methyl cellosolve), ethylene glycol monoethyl ether (ethyl cellosolve), ethylene glycol monobutyl ether (butyl cellosolve), diethylene glycol monomethyl ether, diethylene glycol monoethyl ether, etc.; ketones, such as acetone, methyl ethyl ketone, methyl isobutyl ketone, acetyl acetone, cyclohexanone, etc.; aromatic hydrocarbons, such as benzene, toluene, xylene, ethylamide, etc.; and amides, such as dimethylformamide, N,N-dimethylacetamide, N-methylpyrrolidone, etc. Of these solvents, one or two or more members can be used.

In addition, for the purpose of enhancing the dispersibility of the particle material or stabilizing the dispersion liquid, the dispersion liquid of the present invention may contain a dispersant, a surface treatment agent, a water-soluble binder, or the like (a dispersant or the like) within the range where its characteristics are not impaired.

Examples of the dispersant or the surface treatment agent which is suitably used include a cationic surfactant, an anionic surfactant, a nonionic surfactant, a silane coupling agent, such as an organoalkoxysilane, an organochlorosilane, etc., and a high-molecular weight dispersant, such as a polyethyleneimine-based high-molecular weight dispersant, a polyurethane-based high-molecular weight dispersant, a polyallylamine-based high-molecular weight dispersant, etc. Such a dispersant or surface treatment agent may be properly selected according to the particle diameter of the composite fine particle or the kind of the desired dispersion medium, and the above-described dispersant may be used solely or in admixture of two or more kinds thereof. As the water-soluble binder, polyvinyl alcohol (PVA), polyvinylpyrrolidone (PVP), hydroxy cellulose, polyacrylic acid, and the like can be used.

As for a compounding amount thereof in the dispersion liquid, a total amount of the dispersant and the like (solid content) is preferably in the range of from 1 to 15% by mass, and more preferably in the range of from 2 to 10% by mass relative to the particle material.

As a method for applying the dispersion treatment, known dispersing apparatuses can be used solely or in combination. For example, a bead mill, a nanomizer, a jet mill, a homogenizer, a planetary mill, an ultrasonic dispersion system, and the like can be used solely or in combination. Of these, a bead mill in which the dispersed particle diameter is easily controlled by selecting the bead diameter is suitably used. As for a time required for the dispersion treatment, a time sufficient for the particle material to be uniformly dispersed in the dispersion medium may be adopted.

[3. Silicone Resin Composition]

The silicone resin composition of the present invention is a composition including at least the above-described surface-modified metal oxide particle material of the present invention and a silicone resin-forming component containing at least one member selected from a phenyl silicone resin-forming component and a methyl phenyl silicone resin-forming component, the silicone resin-forming component having a functional group capable of undergoing a crosslinking reaction with a group which the surface-modifying material to be used for the above-described surface-modified metal oxide particle material has.

Incidentally, the "resin composition" as referred to herein is one having fluidity so that it does not have a specified shape and having irreversible deformability such that when deformed once, does not return to an original shape and serves as a raw material of a transparent resin composite as described later. As a state of this resin composition, for example, a liquid state or a gel-like state having thixotropy can be exhibited. In addition, the "resin-forming component" as referred to herein is a component for forming a resin component in a resin composite as described later, and in general, it includes materials that are a monomer, an oligomer, or a prepolymer of a resin component and are liquid.

Here, the silicone resin-forming component which is used for the silicone resin composition of the present invention is not particularly limited so long as it contains at least one member selected from a phenyl silicone resin-forming component and a methyl phenyl silicone resin-forming component and has a functional group capable of undergoing a crosslinking reaction with a group (crosslinking reactive group) which the surface-modifying material to be used for the above-described surface-modified metal oxide particle material has. Meanwhile, as described previously, a hydrosilylation reaction is preferred as the crosslinking reaction, and an alkenyl group or a hydrogen group is preferred as the crosslinking reactive group to be subjected to this hydrosilylation reaction. From this matter, the following can be exemplified as a suitable combination of the surface-modified metal oxide particle material and the silicone resin-forming component.

(1) A case where the crosslinking reactive group in the surface-modified metal oxide particle material is an alkenyl group: silicone resin-forming component having a hydrogen group.

(2) A case where the crosslinking reactive group in the surface-modified metal oxide particle material is a hydrogen group: silicone resin-forming component having at least one member selected from an alkenyl group and an alkynyl group.

(3) A case where the crosslinking reactive group in the surface-modified metal oxide particle material is an alkenyl group and a hydrogen group: silicone resin-forming component having at least one member selected from an alkenyl group and an alkynyl group and a hydrogen group.

In the silicone resin composition, a content of the metal oxide particle is 5% by mass or more relative to a total amount of the surface-modified metal oxide particle and the silicone resin-forming component. When the content is less than 5% by mass, an effect for reducing the gas permeability in the silicone resin composite obtained by curing the resin composition becomes small, so that a substantial effect to be brought due to incorporation of the metal oxide particle is not obtained. The foregoing content is preferably from 20 to 80% by mass, and more preferably from 30 to 70% by mass. Incidentally, the content of the metal oxide particle does not include the surface-modifying material.

(Silicone Resin-Forming Component)

The silicone resin-forming component contains at least one member selected from a phenyl silicone resin-forming component and a methyl phenyl silicone resin-forming component.

Examples of the phenyl silicone resin-forming component include a siloxane polymer having a phenyl group arranged therein. Examples of the methyl phenyl silicone resin-forming component include a siloxane polymer having a phenyl group and a methyl group (alkyl group) arranged therein. In addition, other examples include a modified silicone resin in which a siloxane structure having a phenyl group arranged therein is combined with an epoxy group or other hydrocarbon. Examples of the structure include, in addition to a linear structure, a chain form of a two-dimensional structure, a resin of a three-dimensional network structure, a cage-type structure, and the like.

The phenyl silicone resin-forming component and the methyl phenyl silicone resin-forming component may be used solely, or may be used in combination (the phenyl silicone resin-forming component, the methyl phenyl silicone resin-forming component, and a combination of the both components will be hereinafter sometimes referred to summarizingly as "(methyl) phenyl silicone resin-forming component"). In addition, components having various structures as described above may be combined, or the above-described modified silicone resin may be further added.

First of all, the above-described silicone resin-forming component having a hydrogen group is one containing at least one member selected from the above-descried phenyl silicone resin-forming component and methyl phenyl silicone resin-forming component and further having a hydrogen group. Incidentally, the "hydrogen group" as referred to herein means H (hydrogen) bound directly to Si of the siloxane polymer constituting the silicone resin-forming component, namely H (hydrogen) in the Si—H bond. In addition, there may be the case where the hydrogen group is expressed as "Si—H group".

Here, the above-described silicone resin-forming component may contain other silicone resin-forming component than the (methyl) phenyl silicone resin-forming component. That is, in the present invention, "the silicone resin-forming component has a hydrogen group" means that the hydrogen group may be contained in the (methyl) phenyl silicone resin-forming component; that the hydrogen group may be contained in other silicone resin-forming component (this silicone resin-forming component is sometimes referred to as "hydrogen silicone resin-forming component"; and further that the hydrogen group may be contained in these both components.

According to this silicone resin composition, the hydrogen group in the silicone resin-forming component undergoes a crosslinking reaction with the alkenyl group of the surface-modifying material to achieve integration, thereby preventing phase separation between the surface-modified metal oxide particle material and the matrix silicone resin in the process of polymerization and curing from occurring; and furthermore, the surface-modified metal oxide particle material and the matrix silicone resin come close to each other, whereby a space in the silicone resin composite can be reduced, and the gas permeability can be suppressed.

Examples of the above-described (methyl) phenyl silicone resin-forming component containing a hydrogen group include a material in which at least a phenyl group and a hydrogen group are arranged in a single siloxane polymer. Then, so long as the this requirement is met, the phenyl group and the hydrogen group may be arbitrarily arranged in a single siloxane polymer. It is preferred from the standpoint of polymerization reactivity that two or more hydrogen groups are arranged in a single siloxane polymer.

Meanwhile, examples of the above-described hydrogen silicone resin-forming component include a siloxane polymer in which a part of groups bound to Si is hydrogen (hydrogen group: Si—H bond). It is preferred from the standpoint of polymerization reactivity that two or more hydrogen groups are arranged in a single siloxane polymer. Incidentally, though the group other than the hydrogen group, which is bound to Si, is generally an alkyl group, such as a methyl group, etc., the hydrogen silicone resin-forming component may also be a modified silicone combined with an epoxy group or other hydrocarbon. Examples of the structure include, in addition to a linear structure, a chain form of a two-dimensional structure, a three-dimensional network structure, a cage-type structure, and the like.

Next, the above-described silicone resin-forming component having at least one member selected from an alkenyl group and an alkynyl group is one containing at least one member selected from the above-described phenyl silicone resin-forming component and methyl phenyl silicone resin-forming component and further having at least one group selected from an alkenyl group and an alkynyl group.

Here, the above-described silicone resin-forming component may also contain, in addition to the (methyl) phenyl silicone resin-forming component, other silicone resin-forming component. That is, in the present invention, "the silicone resin-forming component has at least one group selected from an alkenyl group and an alkynyl group" means that at least one group selected from an alkenyl group and an alkynyl group may be contained in the (methyl) phenyl silicone resin-forming component; that at least one group selected from an alkenyl group and an alkynyl group may be contained in the other silicone resin-forming component (this silicone resin-forming component is sometimes referred to as "alkenyl/alkynyl group-containing silicone resin-forming component"); and further that at least one group selected from an alkenyl group and an alkynyl group may be contained in these both components.

According to this silicone resin composition, the alkenyl group or alkynyl group in the silicone resin-forming component and the hydrogen group of the surface-modifying material undergo a crosslinking reaction (hydrosilylation reaction) to achieve integration, thereby preventing phase separation between the surface-modified metal oxide particle material and the matrix silicone resin in the process of polymerization and curing from occurring; and furthermore, the surface-modified metal oxide particle material and the matrix silicone resin come close to each other, whereby a space in the silicone resin composite can be reduced, and the gas permeability can be suppressed.

Examples of the above-described (methyl) phenyl silicone resin-forming component having at least one group selected from an alkenyl group and an alkynyl group include a material in which at least a phenyl group and at least one group selected from an alkenyl group and an alkynyl group are arranged in a single siloxane polymer. Then, so long as this requirement is met, the phenyl group and at least one group selected from an alkenyl group and an alkynyl group may be arbitrarily arranged in a single siloxane polymer. It is preferred from the standpoint of polymerization reactivity that two or more alkenyl groups or alkynyl groups are arranged in a single siloxane polymer.

Examples of this alkenyl group include a vinyl group, an allyl group, a butenyl group, a pentenyl group, and a hexenyl group, with a vinyl group being especially preferred. In addition, examples of the alkynyl group include an ethynyl group and a propargyl group (propynyl group). Then, these alkenyl group and alkynyl group can be arbitrarily combined. For example, a material in which a phenyl group and a vinyl group are arranged in a single siloxane polymer is general, but it should not be construed that the material is limited thereto. A material in which a phenyl group, a vinyl group (alkenyl group), and an ethynyl group (alkynyl group) are arranged in a single siloxane polymer may also be adopted. In addition, a combination of a material in which a phenyl group and a vinyl group (alkenyl group) are arranged in a single siloxane polymer and a material in which a phenyl group and an ethynyl group (alkynyl group) are arranged in other siloxane polymer may also be used.

In addition, examples of the above-described alkenyl/alkynyl group-containing silicone resin-forming component include a material in which at least one group selected from an alkenyl group and an alkynyl group is arranged in a siloxane polymer. The alkenyl group or the alkynyl group in the siloxane polymer is not particularly limited with respect to the position thereof and can be arranged at an arbitrary position. Furthermore, it is preferred from the standpoint of polymerization reactivity that two or more alkenyl groups or alkynyl groups are arranged in a single siloxane polymer. In addition, a modified silicone combined with an epoxy group or other hydrocarbon may also be adopted. Examples of a molecular structure thereof include a linear structure, a linear structure having a branched chain in a part thereof, a branched structure, a cyclic structure, and a resinous structure, with a linear structure or a linear structure having a branched chain in a part thereof being especially preferred.

Incidentally, the combination of an alkenyl group or an alkynyl group is arbitrary similar to the above-described (methyl) phenyl silicone resin-forming component having at least one group selected from an alkenyl group and an alkynyl group and is not particularly limited. Furthermore, for example, a phenyl silicone resin-forming component having an alkenyl group may be combined with a silicone resin-forming component containing an alkenyl group or the like and having an alkynyl group.

In addition, the above-described silicone resin-forming component having at least one member selected from an alkenyl group and an alkynyl group and having a hydrogen group is a combination of the above-described silicone resin-forming component having a hydrogen group and the above-described silicone resin-forming component having at least one member selected from an alkenyl group and an alkynyl group. The combination and arrangement of at least one member selected from an alkenyl group and an alkynyl group and a hydrogen group in the present silicone resin-forming component are arbitrary, and for example, a single siloxane polymer having at least one member selected from an alkenyl group and an alkynyl group and a hydrogen group may be adopted, or a material in which a silicone resin-forming component having at least one member selected from an alkenyl group and an alkynyl group and a silicone resin-forming component having a hydrogen group are mixed may also be adopted.

The silicone resin composition of the present invention contains, as the resin component, at least a (methyl) phenyl silicone resin-forming component and includes a silicone resin-forming component having a functional group capable of undergoing a crosslinking reaction with a group which the surface-modifying material to be used for the surface-modified metal oxide particle material has, and furthermore, there may be the case of including a silicone resin-forming component necessary for forming a matrix silicone resin. A combination of the respective components is not particularly limited so long as the respective components have compatibility with each other.

A refractive index and a viscosity of the uncured (methyl) phenyl silicone resin-forming component or the silicone resin-forming component having a functional group capable of undergoing a crosslinking reaction vary depending upon the structure or chain length of the siloxane polymer, the amount or carbon atom number of the phenyl group or the alkyl group in the siloxane polymer, and the like, and these characteristic values are also reflected on the silicone resin after curing. In consequence, by mixing and regulating the plural resin-forming components in an uncured state, it is possible to provide a refractive index necessary as the matrix silicone resin after curing and also to obtain good moldability and workability in the silicone resin composition. Furthermore, besides the combination of the phenyl silicone resin-forming component with the methyl phenyl silicone resin-forming component and the combination with the silicone resin-forming component having a functional group capable of undergoing a crosslinking reaction, by regulating the kind or amount, or the like of the modified silicone resin to be added, it is possible to control characteristics of the resulting silicone resin composite, such as hardness, tackiness, adhesiveness to a base material, etc.

Incidentally, in the case where it is contemplated to reduce a viscosity of the silicone resin composition from the standpoints of moldability, workability, and the like, an organic solvent having compatibility with the (methyl) phenyl silicone resin-forming component or the silicone resin-forming component having a functional group capable of undergoing a crosslinking reaction and not impairing dispersibility of the surface-modified metal oxide particle may be added. As such an organic solvent, for example, the dispersion medium which is used for the above-described dispersion liquid can be exemplified.

Examples of the liquid (uncured) silicone resin-forming component (matrix silicone resin-forming component) which forms the matrix silicone resin in the resin composite after curing include an addition curing-type silicone composition and a condensation curing-type silicone composition according to the curing method. The addition curing-type silicone composition is a composition containing at least a silicone resin-forming component containing an alkenyl group and a hydrogen group and a platinum group metal-based catalyst and is one in which when the above-described alkenyl group and hydrogen group are bound to each other through an addition reaction (hydrosilylation reaction), whereby the silicone resin-forming components are polymerized and cured.

The condensation curing-type silicone composition is a composition containing a silicone resin-forming component in which at least a molecular chain end thereof is sealed by a hydroxyl group or a hydrolytic group, a silane compound containing at least three hydrolyzable groups bound to the silicon atom in one molecule, and a condensation catalyst containing an aminoxy group, an amino group, a keto oxime group, and the like and is one in which the above-described hydroxyl group or hydrolytic group and the hydrolyzable group cause a condensation reaction, such as dehydration, etc., and are bound to each other, whereby the silicone resin-forming component and the silane compound are polymerized and cured. In consequence, the condensation curing-type silicone composition is a composition containing, as the silicone resin-forming component, a silicone resin-forming component in which at least a molecular chain end thereof is sealed by a hydroxyl group or a hydrolytic group, a silane compound containing at least three hydrolyzable groups bound to the silicon atom in one molecule, and a condensation catalyst containing an aminoxy group, an amino group, a keto oxime group, and the like. Incidentally, as described previously, a phenyl group and a methyl group (alkyl group) are arranged in such a silicone resin-forming component.

In the present invention, any of the addition curing type and the condensation curing type may be chosen as the matrix silicone resin-forming component.

Meanwhile, in the present invention, a functional group capable of undergoing a crosslinking reaction in the silicone resin-forming component and a crosslinking reactive group (an alkenyl group, an alkynyl group, or a hydrogen group)

in the surface-modifying material are integrated with each other through a crosslinking reaction, thereby preventing phase separation between the surface-modified metal oxide particle material and the matrix silicone resin from occurring, and the surface-modified metal oxide particle material and the matrix silicone resin come close to each other, thereby making it possible to suppress the gas permeability. Here, this crosslinking reaction and the above-described addition curing-type addition reaction (hydrosilylation reaction) are the same reaction as being understandable from the reactive groups or reaction state thereof. In consequence, it is preferred to choose an addition curing-type material as the matrix silicone resin-forming component or the reaction catalyst because the integration of the surface-modified metal oxide particle material and the matrix silicone resin by crosslinking and the curing of the matrix silicone resin itself can be performed by the simultaneous and single reaction method. In addition, so long as the addition curing type is concerned, since a by-product, such as water, etc., is not formed at the time of polymerization, an influence due to mingling of the by-product can be avoided, or the removal of the by-product is unnecessary, and hence, such is preferred, too.

Furthermore, as described previously, by using a metal oxide particle having both an alkenyl group and a hydrogen group modified and carried thereon, not only the crosslinking reaction between the alkenyl group on the surface of the metal oxide particle and the hydrogen group in the matrix silicone resin-forming component but also the crosslinking reaction between the hydrogen group on the surface of the metal oxide particle and the alkenyl group (or the alkynyl group) in the matrix silicone resin-forming component can be performed, so that it is possible to contemplate to achieve further integration of the metal oxide particle and the matrix silicone resin with each other.

Incidentally, by choosing a condensation curing type as the matrix silicone resin-forming component, there is brought such an advantage that binding of the surface-modified metal oxide particle material and the matrix silicone resin and curing of the matrix silicone resin can be individually controlled. However, in this case, after the surface-modified metal oxide particle material and the matrix silicone resin are first bound to each other by means of a crosslinking reaction (the same as that in the case of an addition curing type), it is necessary to condensate and cure the matrix silicone resin. A reason for this resides in the matter that in the case of curing the matrix silicone resin in a state where the surface-modified metal oxide particle material and the matrix silicone resin are not bound to each other, there is a concern that the aggregation or phase separation of the surface-modified metal oxide particle material is generated, so that a good silicone resin composite is not obtained.

(Hydrosilylation Catalyst)

In the present invention, the functional group capable of undergoing a crosslinking reaction in the silicone resin-forming component and the crosslinking reactive group in the surface-modifying material are integrated with each other through a crosslinking reaction (hydrosilylation reaction). In consequence, it is preferred that the silicone resin composition of the present invention contains a hydrosilylation catalyst.

Examples of the catalyst for hydrosilylation reaction in the present invention include a platinum-based catalyst, a rhodium-based catalyst, and a palladium-based catalyst. In view of the fact that the hydrosilylation reaction smoothly proceeds, a platinum-based catalyst is especially preferred as the catalyst for hydrosilylation reaction. Examples of this platinum-based catalyst include chloroplatinic acid, an alcohol solution of chloroplatinic acid, an olefin complex of platinum, and an alkenyl siloxane complex of platinum.

A compounding amount of this catalyst for hydrosilylation reaction has only to be an amount sufficient for allowing the above-described silicone resin-forming component and crosslinking reactive group-containing surface-modifying material to undergo a crosslinking reaction. Specifically, in the case where a platinum-based catalyst is used as this catalyst for hydrosilylation reaction, the compounding amount of the catalyst for hydrosilylation reaction is preferably an amount such that a mass of the platinum metal is from 0.1 to 100 ppm relative to a total amount of the above-described silicone resin-forming component containing an alkenyl group or an alkynyl group and the surface-modifying material containing a hydrogen group, and in particular, it is more preferably an amount in the range of from 1 to 50 ppm from the standpoint that not only the hydrosilylation reaction smoothly proceeds, but also the silicone resin composite obtained by the reaction is hardly colored.

In addition, in the case of choosing an addition curing type as the matrix silicone resin-forming component, since the curing of the matrix silicone resin also relies upon the hydrosilylation reaction, it is preferred to increase the amount of the catalyst such that it coincides with the above-described requirement. That is, a mass of the platinum metal is preferably from 0.1 to 100 ppm, and more preferably from 1 to 50 ppm relative to a total amount of the silicone resin-forming component containing an alkenyl group or an alkynyl group, the silicone resin-forming component containing a hydrogen group, and the surface-modifying material containing a hydrogen group.

Furthermore, as described previously, in the case of using a metal oxide particle having both a hydrogen group and an alkenyl group or alkynyl group modified and carried thereon, since the alkenyl group or alkynyl group on the surface of the metal oxide particle and the hydrogen group in the matrix silicone resin-forming component also undergo a crosslinking reaction, it is preferred to similarly increase the amount of the catalyst. That is, a mass of the platinum metal is preferably from 0.1 to 100 ppm, and more preferably from 1 to 50 ppm relative to a total amount of the silicone resin-forming component containing an alkenyl group or an alkynyl group, the silicone resin-forming component containing a hydrogen group, the surface-modifying material containing a hydrogen group, and the surface-modifying material containing an alkenyl group or an alkynyl group.

Regarding a method for mixing the surface-modified metal oxide particle material and the matrix silicone resin-forming component, examples thereof include a method in which the surface-modified metal oxide particle material is introduced directly into the matrix silicone resin-forming component, and the contents are mechanically mixed using a kneading machine or the like; and a method in which as in the case of the above-described dispersion liquid, the surface-modified metal oxide particle material is dispersed in a dispersion medium, such as an organic solvent, etc., to prepare a surface-modified metal oxide particle material dispersion liquid, this dispersion liquid is mixed with the matrix silicone resin-forming component using an agitator or the like, and subsequently, the organic solvent is removed.

By mixing the both materials by any one of the foregoing methods, the silicone resin composition of the present invention is obtained. Incidentally, the silicone resin composition of the present invention may also be one containing the organic solvent or the like used in the above-described mixing process.

[4. Silicone Resin Composite]

The silicone resin composite of the present invention is obtained by not only polymerizing and curing the matrix silicone resin-forming component in the above-described silicone resin composition of the present invention by means of an addition reaction, a condensation reaction, or the like but also binding the surface-modifying material of the metal oxide particle and the matrix silicone resin-forming component to each other by means of a crosslinking reaction, thereby integrating the surface-modified metal oxide particle and the matrix silicone resin with each other.

Here, though the "resin composite" has a specified shape, the terms "having a prescribed shape" mean that the resin composite does not have irreversible deformability, such as a liquid form, a gel-like form, etc., but a fixed shape coincident with the use purpose or method can be kept. That is, the resin composite include general solids which are not substantially deformed and besides, materials having elastic deformability (shape restoration properties), such as rubber materials, etc., and it is not exhibited that the shape itself is a specified shape.

The shape of the silicone resin composite is not particularly limited, and it may be chosen in conformity with an application. Here, the silicone resin which is used in the present invention does not exhibit thermoplasticity or solvent solubility as general resins exhibit, after being cured by means of an addition reaction or a polymerization reaction. For this reason, it is preferred to perform molding of the silicone resin composite during curing the above-described silicone resin composition to form a silicone resin composite, or to subject the silicone resin composite after curing to mechanical processing, such as cutting, etc. Here, the case of performing molding during curing the silicone resin composition to form a silicone resin composite is described.

First of all, the silicone resin composition of the present invention is molded using a die or a frame or filled in a die or a frame-like container, thereby obtaining a molding or a filler having been molded in a desired shape. At this point of time, the molding or filler is in a state having fluidity.

On this occasion, in the case where the silicone resin composition to be used is high in viscosity and poor in moldability, the silicone resin composition may be adjusted by previously adding an organic solvent or the like and stirring and mixing the contents to decrease the viscosity, thereby making the viscosity suitable for molding or filling.

Meanwhile, in the case where the silicone resin composition to be used is low in viscosity, the silicone resin composition can be adjusted by previously polymerizing or crosslinking a part of the matrix silicone resin-forming component or the matrix silicone resin-forming component and a part of the surface-modifying material to increase the viscosity, thereby making the viscosity suitable for molding or filling. In addition, in the case where the silicone resin composition contains an organic solvent, the viscosity can also be increased by removing a part or whole of this organic solvent by volatilization or other means. Furthermore, the above-described silicone resin composition may also be mixed as a master batch with other resin and used.

Subsequently, by allowing this molding or filler to stand for a prescribed time at room temperature (about 25° C.) as it is, or after heating to a prescribed temperature (from room temperature to 150° C., and preferably from 80° C. to 150° C.), or by irradiating this molding or filler with an electron beam or a light ray (active energy ray) having an arbitrary wavelength of from an ultraviolet ray region to an infrared ray region, not only the matrix silicone resin-forming component in this silicone resin composition is cured by means of an addition reaction, a polymerization reaction, or the like, but also the surface-modifying material of the metal oxide particle and the matrix silicone resin-forming component are bound to each other by means of a crosslinking reaction, thereby integrating the surface-modified metal oxide particle and the matrix silicone resin with each other.

Incidentally, in the case where the organic solvent remains in this molding or filler, it is preferred to vaporize and remove this organic solvent in advance.

According to this, even when after taking away this molding or filler from the die or container, an external force is applied, the state in which a fixed shape can be kept, namely the silicone resin composite, can be obtained.

Incidentally, if there is no problem in the application, it is not always necessary to take away the silicone resin composite from the die or container. For example, in an optical semiconductor light emitting device as described later, the device itself has a shape which forms a container.

In the case of using the silicone resin composite of the present invention for a sealing material of an optical semiconductor light emitting device or the like, its refractive index is preferably higher than 1.54, more preferably 1.56 or more, still more preferably 1.58 or more, and most preferably 1.6 or more. By increasing the refractive index of the sealing material, it is possible to enhance light extraction efficiency from the optical semiconductor light emitting device, thereby achieving high luminance.

In addition, when an optical path length is defined as 0.5 mm, a transmittance at a wavelength of 450 nm is preferably 40% or more, more preferably 60% or more, and still more preferably 70% or more. So long as the transmittance falls within this range, for example, in the case of using the silicone resin composite as an optical component, it is possible to suppress a lowering of optical transmission loss as a constituent member.

It is possible to allow the refractive index or transmittance of the silicone resin composite to fall within a desired range by properly adjusting the kind or particle diameter of the metal oxide particle, the formulation of the matrix silicone resin, the amount of the metal oxide particle in the silicone resin composite, or the like. In the silicone resin composite of the present invention, in view of the fact that the surface-modifying material of the metal oxide particle has a phenyl group, the surface-modifying material per se is made to have a high refractive index, and therefore, it does not disturb an increase of the refractive index of the silicone resin composite.

Incidentally, though the refractive index of the above-described silicone resin composite may be measured using a known method, for example, it can be determined by using a composite (thickness: 1 mm) formed on an aluminum substrate and measuring a value at a wavelength of 594 nm at room temperature by a prism coupler. A measurement method of the transmittance is described later.

An application of the silicone resin composite of the present invention is not particularly limited. In particular, the silicone resin composite can be suitably utilized as an optical component utilizing the above-described excellent characteristics thereof. Examples of an optical functional device provided with such an optical component include various display devices (e.g., liquid crystal displays, plasma displays, etc.), various projector devices (e.g., OHP, liquid crystal projectors, etc.), optical fiber communication systems (e.g., optical waveguides, optical amplifiers, etc.), imaging systems, such as cameras, video cameras, etc., light fittings, such as LED lighting devices, etc., and the like.

[5. Optical Semiconductor Light Emitting Device]

The optical semiconductor light emitting device of the present invention comprises a semiconductor light emitting element sealed with a sealing material; the sealing material is composed of the silicone resin composite of the present invention; and a sealing layer made of the sealing material has a thickness of 50 µm or more. When the thickness of the sealing layer is less than 50 µm, the gas permeability cannot be sufficiently suppressed at a low level. The thickness of the sealing layer is preferably 100 µm or more, and more preferably 200 µm or more.

A constitution of the sealing layer according to the present invention may be one in which the whole of the sealing layer of the optical semiconductor light emitting device is made of a layer of the silicone resin composite of the present invention (first aspect), or may be one in which a part of the sealing layer of the optical semiconductor light emitting device is made of a layer of the silicone resin composite of the present invention, and other sealing layer is laminated thereon (second aspect). In addition, such a sealing layer may contain a phosphor.

As described previously, since the optical semiconductor light emitting device of the present invention is excellent in gas barrier properties of the sealing layer, for example, deterioration of a silver-plated reflector provided within a light emitting diode (LED) package can be suppressed, and a lowering of the luminance of radiated light from the light emitting diode package can be reduced while keeping it high, and thus, it can be effectively utilized as a light fitting or liquid crystal imaging device provided with this.

The optical semiconductor light emitting device is specifically described. Incidentally, it should be construed that the present invention is not particularly limited to the following examples.

As shown in FIG. 1, in the first aspect (light emitting device 10) according to the present invention, a light emitting element 14 is disposed at a recessed part 12A of a reflection cup 12, and a first sealing layer 16 constituted of a sealing material composed of the silicone resin composite of the present invention is formed so as to bury the recessed part in contact with the light emitting element 14.

According to such a device, after the light emitted from the light emitting element 14 passes through a boundary surface with the sealing material, it passes through the inside of the sealing material and is extracted outside directly or after being reflected by the wall surface of the reflection cup 12.

As the light emitting element constituting the light emitting device, for example, a light emitting diode (LED) and a semiconductor laser can be exemplified. Here, as the light emitting diode, a red light emitting diode that emits red light (for example, light having a wavelength of 640 nm), a green light emitting diode that emits green light (for example, light having a wavelength of 530 nm), and a blue light emitting diode that emits blue light (for example, light having a wavelength of 450 nm) can be exemplified. The light emitting diode may have a so-called face-up structure, or may have a flip-chip structure. That is, the light emitting diode is constituted of a substrate and a light emitting layer formed on the substrate, and it may have a structure in which light is emitted to the outside from the light emitting layer, or may have a structure in which light from the light emitting layer is emitted to the outside through the substrate.

More specifically, for example, the light emitting diode has a structure in which a first cladding layer composed of a compound semiconductor layer having a first conductivity type (for example, an n-type) formed on a substrate, an active layer formed on the first cladding layer, and a second cladding layer composed of a compound semiconductor layer having a second conductivity type (for example, a p-type) formed on the active layer are laminated, and it is provided with a first electrode which is electrically connected to the first cladding layer and a second electrode which is electrically connected to the second cladding layer. The layer constituting the light emitting diode may be constituted of well-known compound semiconductor materials depending on an emission wavelength.

Here, a refractive index of the light emitting layer of the light emitting diode is, for example, about 3.5 for GaAs systems, about 3.2 for GaP systems, and about 2.5 for GaN systems, respectively, and a refractive index of a usually used sapphire system is about 1.75; and in all of the cases, the refractive index is considerably high. However, a refractive index of a conventionally used sealing material made of a silicone resin system or epoxy resin system is from about 1.4 to 1.5 at most. Thus, since a difference in refractive index between the light emitting layer and the sealing material, or between the sapphire substrate and the sealing material, is large, the majority of light from the light emitting layer is totally reflected at an interface therebetween and confined within the light emitting layer or within the sapphire substrate, so that the light extraction efficiency could not be increased.

In the optical semiconductor light emitting device of the present invention, by increasing the refractive index of the sealing material, it is possible to reduce the light emission quantity to be totally reflected between the light emitting layer and the sealing material or between the sapphire substrate and the sealing material, thereby increasing the light extraction efficiency. From this standpoint, the refractive index of the sealing material is preferably higher than 1.54, more preferably 1.56 or more, still more preferably 1.58 or more, and most preferably 1.6 or more. In addition, when an optical path length is defined as 0.5 mm, a transmittance at a wavelength of 450 nm is preferably 40% or more, more preferably 60% or more, and still more preferably 70% or more.

Figure 2:
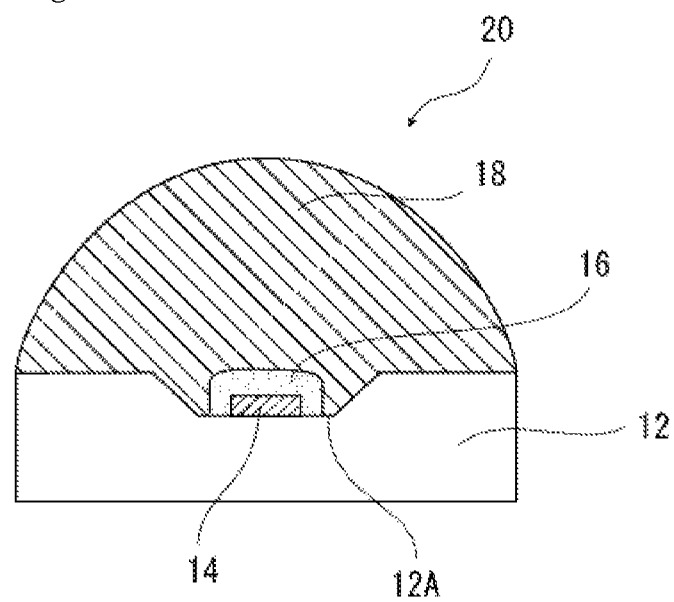
FIG. 2 is a cross-sectional view schematically showing another embodiment of an optical semiconductor light emitting device of the present invention.

As shown in FIG. 2, the second aspect (light emitting device 20) according to the present invention is the same as the first aspect, except that the first sealing layer 16 is formed so as to cover the surface of the light emitting element 14, and at the outer side thereof, a second sealing layer 18 having a formulation different from the sealing composition for optical semiconductor element of the present invention is formed.

Examples of a material of the second sealing layer 18 having a different formulation include resins or resin composites, such as methyl silicone, modified silicone, an acrylic resin, an epoxy resin, a polyimide resin, etc. For the purpose of not only further reducing interface reflection between the first sealing layer 16 and the second sealing layer 18 but also further reducing interface reflection between the second sealing layer 18 and the outside, a refractive index of the second sealing layer 18 is preferably equal to or less than the refractive index of the first sealing layer 16 and equal to or more than 1 (the refractive index of the air). In addition, for the purpose of adjusting the refractive index of the second sealing layer 18, the surface-modified metal oxide particle according to the present invention may also be contained in the second sealing layer.

In addition, the optical semiconductor light emitting device of the present invention can be made to be an optical semiconductor light emitting device in which a light emitting element and a phosphor are combined. According to the optical semiconductor light emitting device of the present invention, though the first sealing layer in contact with the optical semiconductor element is made of the silicone resin composite of the present invention as described previously, this first sealing layer may contain, for example, a phosphor, such as a YAG phosphor for blue InGaN, an RGB phosphor for ultraviolet rays, etc. This phosphor may be previously contained in the silicone resin composition for forming the silicone resin composite that is the sealing material of the present invention. As a method thereof, a method of directly mixing the phosphor in the silicone resin composition, a method of mixing the phosphor in a phenyl silicone resin-forming component or a methyl phenyl silicone resin-forming component, a method of mixing a dispersion liquid having the phosphor dispersed in an organic solvent or the like with the silicone resin composition and then removing the organic solvent or the like, and the like can be exemplified.

In particular, taking into consideration the case of reducing the use amount of the phosphor from the standpoint of the cost, or the case of increasing the light conversion efficiency by centrally disposing the phosphor in the neighborhood of the light emitting element, it is preferred that the phosphor is contained in the first sealing layer in the second aspect. An amount of the phosphor is preferably from 5 to 80% by mass, and more preferably from 20 to 70% by mass relative to a mass of the first sealing layer. Incidentally, the phosphor can also be contained in the second sealing layer.

As such an optical semiconductor light emitting device in which a light emitting element and a phosphor are combined, a white light emitting diode (for example, a light emitting diode that emits white light by combining an ultraviolet ray or blue light emitting diode and a phosphor particle) can be exemplified.

EXAMPLES

The present invention is hereunder specifically described with reference to the following Examples and Comparative Examples, but it should not be construed that the present invention is limited to these Examples.

With respect to the present Examples, various measurements and evaluations were performed in the following manners.
(Average Primary Particle Diameter of Metal Oxide Particle)

An average primary particle diameter of a metal oxide particle was defined as a Scherrer's diameter which is obtained by calculation from a half-value width of an X-ray diffraction peak. This is because so long as the primary particle diameter is a nanometer size, a possibility that one particle is constituted of plural crystallites is low, so that the average primary particle diameter and the Scherrer's diameter are substantially equal to each other.
(Transmittance of Silicone Resin Composite)

A transmittance of a silicone resin composite was measured by using a composite (thickness: 0.5 mm) of each of the Examples formed on a glass base material and using a spectrophotometer (integrating sphere). Then, in Examples A1 to A5 and Comparative Examples A1 to A4, the case where a reduction amount of transmittance at a wavelength of 450 nm relative to a silicone resin simple substance (Comparative Example 1) was less than 10% was defined as "A", and the case where it was 10% or more was defined as "B". In addition, in Examples B1 to B5 and Comparative Examples B1 to B6, a transmittance at a wavelength of 450 nm was determined.
(Heat Resistance of Silicone Resin Composite)

In Examples A1 to A5 and Comparative Examples A1 to A4, heat resistance of a silicone resin composite was evaluated by applying a load to the above-described composite (cured material) having a thickness of 0.5 mm in an electric furnace at 150° C. for 500 hours and then measuring a transmittance using a spectrophotometer (integrating sphere). The case where a transmittance at a wavelength of 450 nm after thermal loading was reduced by 30% or more as compared with an initial value (before thermal loading) was defined as "B", and the case where a reduction amount was less than 30% was defined as "A".

Meanwhile, in Examples B1 to B5 and Comparative Examples B1 to B6, the evaluation was performed by using a composite (thickness: 0.5 mm) of each of the Examples formed on a glass base material and using a spectrophotometer (integrating sphere) to measure a transmittance. Specifically, a silicone resin composite was put into a dryer at 120° C., and after elapsing 1,000 hours, a transmittance at 450 nm was compared with an initial transmittance. The case where a reduction rate of transmittance relative to the initial value was less than 5% was defined as "A"; the case where it was 5% or more and less than 25% was defined as "B"; and the case where it was 25% or more was defined as "C".
(Gas Permeability (Gas Barrier Properties) of Silicone Resin Composite)

Gas permeability (gas barrier properties) of a silicone resin composite was evaluated in the following manner.

First of all, an LED package having a silver-plated reflector was sealed with a silicone resin composition, and the silicone resin composition was cured by a thermal treatment at 150° C. for 3 hours, thereby obtaining a composite of each of the Examples. The resulting package was hermetically sealed together with 0.3 g of a sulfur powder in a 500-mL pressure-resistant glass container and kept at 80° C. An appearance change with time of the silver-plated reflector (corrosion (blackening discoloration) of silver plate by sulfur gas) was observed through visual inspection. In Examples A1 to A5 and Comparative Examples A1 to A4, the case where as compared with the silicone resin not containing a metal oxide particle (Comparative Example A1), the discoloration was slow, and a time required for assuming the equal blackening was 1.5 times or more was evaluated to be low in gas permeability and defined as "A"; the case where as compared with the silicone resin, while the discoloration was slow, a time required for assuming the equal blackening was less than 1.5 times was defined as "B"; and the case where the silver plate was discolored equally to or faster than the silicone resin was defined as "C".

Meanwhile, in Examples B1 to B5 and Comparative Examples B1 to B6, blackening of an appearance of the above-described silver-plated reflector (corrosion (blackening discoloration) of silver plate by sulfur gas) was observed through visual inspection and evaluated in terms of a time required for reaching the same degree as that in a separately fabricated standard plate (plate prepared by blackening a silver-plated reflector directly with a sulfur gas). Incidentally, the lower the gas barrier properties of the composite, the shorter the time required for reaching blackening was.
(Hardness Evaluation of Silicone Resin Composite)

With respect to the hardness evaluation of a silicone resin composite, at the time of fabricating a silicone resin composite, the case where no crack was generated was defined as "A", and the case where a crack was generated was defined as "B" (Examples B1 to B5 and Comparative Examples B1 to B6).

(Thickness of Sealing Layer Made of Silicone Resin Composite)

A thickness of a sealing layer made of a silicone resin composite was measured by observing a cross section of the above-described package by SEM.

Example A1

(Fabrication of Zirconia Particle)

To a zirconium salt solution of 2,615 g of zirconium oxychloride octahydrate dissolved in 40 L (liters) of pure water, dilute ammonia water of 344 g of 28% ammonia water dissolved in 20 L of pure water was added while stirring, thereby preparing a zirconia precursor slurry.

Subsequently, a sodium sulfate aqueous solution of 300 g of sodium sulfate dissolved in 5 L of pure water was added to this slurry while stirring. At this time, the addition amount of sodium sulfate was 30% by mass relative to a zirconia conversion value of a zirconium ion in the zirconium salt solution.

Subsequently, this mixture was dried in the air at 130° C. for 24 hours by using a dryer, thereby obtaining a solid.

Subsequently, this solid was pulverized by an automatic mortar and then baked in the air at 500° C. for one hour by using an electric furnace.

Subsequently, this baked material was put into pure water and stirred to make into a slurry form. Thereafter, cleaning was performed using a centrifugal separator, and the added sodium sulfate was sufficiently removed, followed by drying with a dryer, thereby obtaining a zirconia particle having an average primary particle diameter of 4 nm.

(Surface Modification on Zirconia Particle: Fabrication of Surface-Modified Zirconia Particle)

Subsequently, to 10 g of the zirconia particle, 82 g of toluene and 5 g of a methoxy group-containing phenyl silicone resin (KR217, manufactured by Shin-Etsu Chemical Co., Ltd.) were added and mixed, and the mixture was subjected to a surface modification treatment with a bead mill for 6 hours, followed by removing the beads. Subsequently, 3 g of vinyltrimethoxysilane (KBM1003, manufactured by Shin-Etsu Chemical Co., Ltd.) was added, and the contents were subjected to surface modification and dispersion treatment under refluxing at 130° C. for 6 hours, thereby preparing a transparent dispersion liquid of zirconia particle having been surface-modified with a surface-modifying material having a phenyl group and a surface-modifying material having a vinyl group that is an alkenyl group.

(Fabrication of Silicone Resin Composition)

To 50 g of the above-described transparent dispersion liquid of zirconia particle, 7.6 g of, as a phenyl silicone resin, a trade name: OE-6520 (manufactured by Dow Corning Toray Co., Ltd., refractive index: 1.54, compounding ratio of liquid A/liquid B=1/1) (liquid A: 3.8 g, liquid B: 3.8 g) was added, and after stirring, the toluene was removed by drying under reduced pressure, thereby obtaining a silicone resin composition containing a surface-modified zirconia particle, a phenyl silicone resin, and a reaction catalyst (zirconia particle content: 30% by mass).

Incidentally, with respect to OE-6520, not only the presence of an Si—H bond is already confirmed by means of an NMR analysis, but also it is already grasped that a hydrogen group is contained in the silicone resin-forming component. In consequence, OE-6520 can be integrated with the vinyl group (alkenyl group) of vinyltrimethoxysilane that surface-modifies the zirconia particle through a crosslinking reaction.

In addition, with respect to OE-6520, not only the presence of a C=C double bond (vinyl group) that is an alkenyl group is already confirmed by means of an NMR analysis, but also the presence of platinum is already confirmed by means of an emission analysis. That is, OE-6520 is a silicone resin of an addition curing type, which is polymerized and cured by means of an addition reaction (hydrosilylation reaction). In consequence, it can be understood that in OE-6520, not only the vinyl group in the zirconia particle surface-modifying material and the hydrogen group in OE-6520 are bound to each other through a crosslinking reaction in the presence of platinum as a catalyst, but also the vinyl group and the hydrogen group in OE-6520 undergo an addition reaction, whereby the silicone resin-forming component is polymerized and cured in a state of keeping the dispersed state of the zirconia particle.

(Fabrication of Silicone Resin Composite)

The above-described silicone resin composition was cured by a thermal treatment at 150° C. for 3 hours, thereby obtaining a silicone resin composite.

The already-described various evaluations were performed by using this silicone resin composite. Incidentally, in the evaluation of gas permeability, the thickness of the sealing layer was made to be 500 μm.

Example A2

(Fabrication of Zirconia Particle)

A zirconia particle was fabricated in the same manner as that in Example A1.

(Fabrication of Surface-Modifying Material Containing Both a Phenyl Group and an Alkenyl Group)

Preparation of Surface-Modifying Material A: $(CH_2=CH(CH_3)_2SiO(SiO(C_6H_5)_2)_{45}Si(OC_2H_5)_3$ 1.8 g of dimethyl vinyl silanol was dissolved in 60 mL of a tetrahydrofuran (THF) solvent in a nitrogen atmosphere, 1.2 g of n-butyl lithium dissolved in n-hexane was added dropwise at a temperature of 0° C. while stirring, and the contents were allowed to react with each other for 3 hours, thereby obtaining lithium dimethyl vinyl silanolate (see formula (A)).

Subsequently, a solution of 160.5 g of hexaphenyl cyclotrisiloxane dissolved in a THF solvent was added dropwise, and the contents were allowed to react with each other at a temperature of 0° C. for 12 hours, thereby obtaining lithium phenylvinyl organosilanolate (see formula (B)).

Subsequently, 3.6 g of chlorotriethoxysilane was added, and the contents were allowed to react with each other at a temperature of 0° C. for 12 hours (see formula (C)).

Subsequently, n-hexane was mixed to form a precipitate of lithium chloride, and thereafter, the lithium chloride was removed by filtration, thereby obtaining a surface-modifying material A containing both a phenyl group and an alkenyl group.

A structure of the obtained surface-modifying material was confirmed by means of 1H-NMR.

Here, an outline of the synthesis flow of the surface-modifying material containing both a phenyl group and an alkenyl group is shown below.

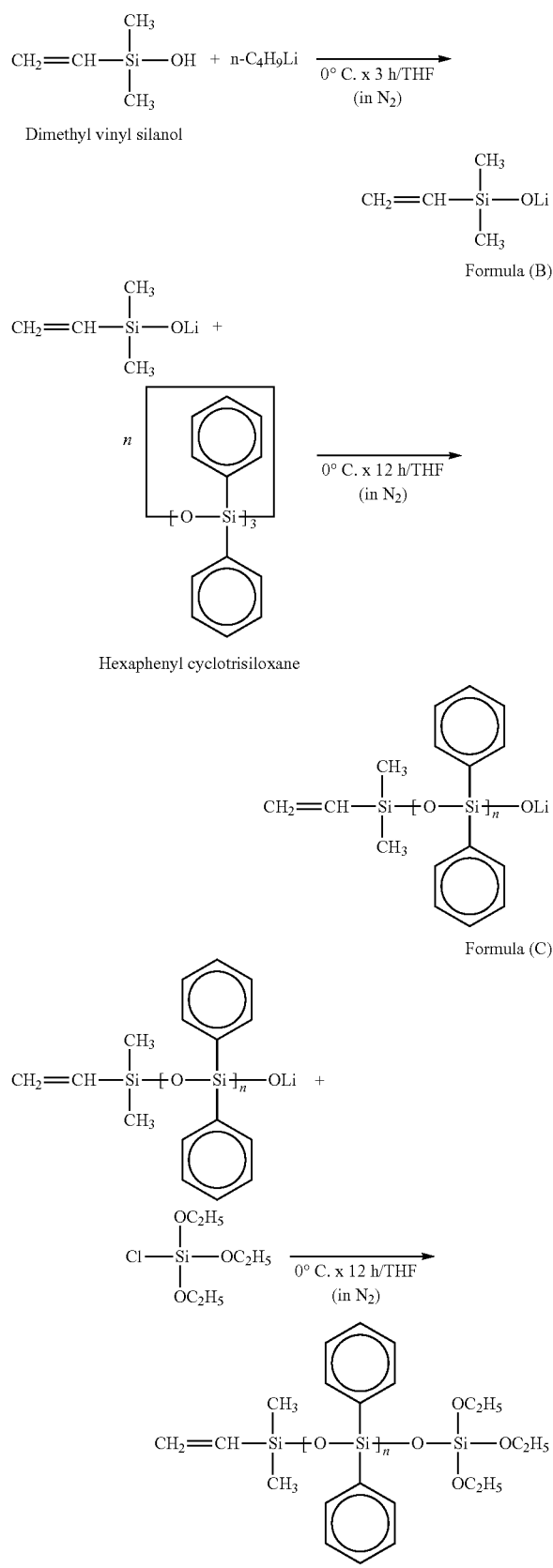

(Surface Modification on Zirconia Particle: Fabrication of Surface-Modified Zirconia Particle)

Subsequently, to 10 g of the zirconia particle, 80 g of toluene and 5 g of a methoxy group-containing phenyl silicone resin (KR217, manufactured by Shin-Etsu Chemical Co., Ltd.) were added and mixed, and the mixture was subjected to a surface modification treatment with a bead mill for 6 hours, followed by removing the beads. Subsequently, 3 g of the above-described surface-modifying material A was added, and the contents were subjected to surface modification and dispersion treatment under refluxing at 130° C. for 6 hours, thereby preparing a transparent dispersion liquid of zirconia particle having been surface-modified with a surface-modifying material having a phenyl group and a surface-modifying material having both a phenyl group and an alkenyl group (vinyl group).

(Fabrication of Silicone Resin Composition and Silicone Resin Composite)

A silicone resin composition and further a silicone resin composite were fabricated in the same manners as those in Example A1, except for using the above-described methoxy group-containing phenyl silicone resin and the transparent dispersion liquid of zirconia particle having been surface-modified with the surface-modifying material A, followed by performing the various evaluations.

Example A3

A silicone resin composition and further a silicone resin composite were fabricated in the same manners as those in Example A1, except for making the thickness of the sealing layer to be 30 μm, followed by performing the various evaluations.

Example A4

(Fabrication of Titania Particle)

242.1 g of titanium tetrachloride and 111.9 g of tin(IV) chloride pentahydrate were put into 1.5 L (liters) of pure water at 5° C., and the contents were stirred to fabricate a mixed solution.

Subsequently, this mixed solution was heated to adjust the temperature at 25° C., and an ammonium carbonate aqueous solution having a concentration of 10% by mass was added to this mixed solution, thereby adjusting a pH at 1.5. Thereafter, the resultant was aged at 25° C. for 24 hours, and thereafter, an excessive chloride ion was removed by means of ultrafiltration.

Subsequently, water was removed from the mixed solution after removal of a chloride ion by using an evaporator, followed by drying to fabricate a titanium oxide particle. The obtained titanium oxide particle had an average primary particle diameter of 4 nm.

A titania transparent dispersion liquid was fabricated by performing the surface modification, and subsequently, a silicone resin composition and further a silicone resin composite were fabricated in the same manners as those in Example A1, except for using the foregoing titanium particle, followed by performing the various evaluations.

Example A5

(Fabrication of Silica Particle)

80 g of methanol was mixed with 20 g of ammonia water having a concentration of 24%, 0.8 g of 10N—NaOH, and 4 g of a polyoxyethylene alkyl ether (a trade name: EMULGEN 707, manufactured by Kao Corporation) as a surfactant. 4 g of tetraethyl silicate (a trade name: ETHYL SILICATE 28, manufactured by Colcoat Co., Ltd.) diluted with methanol was added dropwise thereto. The mixed liquid was stirred at 20° C. for one hour. After completion of stirring, a precipitate was separated by means of decantation, and an operation of redispersion in methanol and decantation was repeated, thereby removing residual ions.

The obtained wet silica particle was dried under reduced pressure to dry the methanol, thereby obtaining a formed silica particle. The obtained silica particle had an average primary particle diameter of 4 nm.

A silica transparent dispersion liquid was fabricated by performing the surface modification, and subsequently, a silicone resin composition and further a silicone resin composite were fabricated in the same manners as those in Example A1, except for using the silica particle, followed by performing the various evaluations.

Comparative Example A1

The silicone resin (in which, however, no metal oxide particle was added) used in Example A1 was subjected to the same various evaluations as those in Example A1. Incidentally, with respect to three points of the transmittance of silicone resin composite, the heat resistance of silicone resin composition, and the gas permeability of silicone resin composite, values of the present Comparative Example A1 which is free from a metal oxide particle were made to be standard values.

Comparative Example A2

A zirconia particle having an average primary particle diameter of 2 nm was fabricated in the same manner as that in Example A1, except for changing an electric furnace baking temperature in the fabrication of zirconia particle from 500° C. to 450° C. A silicone resin composition and further a silicone resin composite were fabricated in the same manners as those in Example A1, except for using the foregoing zirconia particle, followed by performing the various evaluations.

Comparative Example A3

A zirconia particle having an average primary particle diameter of 15 nm was fabricated in the same manner as that in Example A1, except for changing an electric furnace baking temperature in the fabrication of zirconia particle from 500° C. to 600° C. A silicone resin composition and further a silicone resin composite were fabricated in the same manners as those in Example A1, except for using the foregoing zirconia particle, followed by performing the various evaluations.

Comparative Example A4

A surface-modified zirconia particle was fabricated in the same manner as that in Example A1, except for changing the surface-modifying material used in Example A1 to 6 g of methacryloxy propyltrimethoxysilane and 2 g of isopropyl trimethoxysilane, respectively, and a silicone resin composition and further a silicone resin composite were fabricated in the same manners as those in Example A1, followed by performing the various evaluations.

Details and evaluation results of the silicone resin composites in the foregoing respective Examples and Comparative Examples are summarizingly shown in Tables 1 and 2.

TABLE 1

| | Metal oxide particle | Primary particle diameter [nm] | Refractive index of metal oxide particle | Surface-modifying material | Content of metal oxide particle [% by mass] | Thickness of sealing layer [μm] |
|---|---|---|---|---|---|---|
| Example A1 | ZrO$_2$ | 4 | 2.1 | Methoxy group-containing phenyl silicone resin<br>Vinyl trimethoxysilane | 30 | 500 |
| Example A2 | ZrO$_2$ | 4 | 2.1 | Methoxy group-containing phenyl silicone resin<br>Phenyl silicone having ethoxy introduced into one end thereof and having vinyl introduced into the other end thereof (surface-modifying material A) | 30 | 500 |
| Example A3 | ZrO$_2$ | 4 | 2.1 | Methoxy group-containing phenyl silicone resin<br>Vinyl trimethoxysilane | 30 | 30 |
| Example A4 | TiO$_2$ | 4 | 2.6 | Methoxy group-containing phenyl silicone resin<br>Vinyl trimethoxysilane | 30 | 500 |
| Example A5 | SiO$_2$ | 4 | 2.6 | Methoxy group-containing phenyl silicone resin<br>Vinyl trimethoxysilane | 30 | 500 |
| Comparative Example A1 | — | — | — | — | — | 500 |
| Comparative Example A2 | ZrO$_2$ | 2 | 2.1 | Methoxy group-containing phenyl silicone resin<br>Vinyl trimethoxysilane | 30 | 500 |
| Comparative Example A3 | ZrO$_2$ | 15 | 2.1 | Methoxy group-containing phenyl silicone resin<br>Vinyl trimethoxysilane | 30 | 500 |
| Comparative Example A4 | ZrO$_2$ | 4 | 2.1 | Methacryloxy propyltrimethoxysilane<br>Isopropyl trimethoxysilane | 30 | — |

TABLE 2

| | Evaluation of transmittance of silicone resin composite | Evaluation of heat resistance of silicone resin composite | Evaluation of gas permeability of silicone resin composite |
|---|---|---|---|
| Example A1 | A | A | A |
| Example A2 | A | A | A |
| Example A3 | A | A | B |
| Example A4 | A | A | A |
| Example A5 | A | A | A |

TABLE 2-continued

|  | Evaluation of transmittance of silicone resin composite | Evaluation of heat resistance of silicone resin composite | Evaluation of gas permeability of silicone resin composite |
|---|---|---|---|
| Comparative Example A1 | (Standard) | (Standard) | (Standard) |
| Comparative Example A2 | A | A | C |
| Comparative Example A3 | B | A | A |
| Comparative Example A4 | B | B | — |

The transmittance of silicone resin composite in Examples A1 to A5 is equal to the value of the silicone resin simple substance (Comparative Example A1) that is a standard, and a significant reduction was not found. In addition, with respect to the heat resistance of silicone resin composite, as compared with the initial value, a reduction of 30% or more in the transmittance after thermal loading was not found, and there was no problem.

With respect to the gas permeability of silicone resin composite in Examples A1, A2, A4 and A5, as compared with the silicone resin simple substance (Comparative Example A1) that is a standard, the time required for assuming the equal blackening was 1.5 times or more, and a lowering of gas permeability, namely a distinct enhancement of gas barrier properties, was confirmed. In addition, in Example A3, though a lowering of gas permeability was also confirmed, a degree thereof was low as compared with that in other Examples. It may be considered that this was caused due to the fact that the thickness of the sealing layer was thin as 30 μm.

Meanwhile, with respect to Comparative Example A2, the gas permeability was high, so that sufficient gas barrier properties were not obtained. It may be considered that this was caused due to the fact that the particle diameter of metal oxide was small, and the viscosity of silicone resin composition was high, and therefore, the workability was poor, and sealing itself was not sufficiently performed.

In addition, with respect to Comparative Example A3, the transmittance of light was lowered. It may be considered that this was caused due to the fact that the particle diameter of metal oxide was large, and therefore, scattering of light was generated.

In addition, with respect to Comparative Example A4, both the transmittance of light and the heat resistance were lowered. It may be considered that this was caused due to the surface-modifying material. That is, it may be considered that a lowering of the transmittance of light was caused due to the facts that since the surface-modifying material of the present Comparative Example did not contain an alkenyl group, it did not have binding properties to the matrix silicone resin-forming component; and further that since it did not contain a phenyl group, an affinity thereof with the matrix silicone resin-forming component was low, and therefore, the metal oxide particle caused aggregation at the time of formation of silicone resin composite (at the time of curing of silicone resin composition). In addition, with respect to the lowering of heat resistance, it may be considered that the surface-modifying material of the present Comparative Example did not have a phenyl group or the like, so that the heat resistance was low.

Example B1

(Fabrication of Zirconia Particle)

To a zirconium salt solution of 2,615 g of zirconium oxychloride octahydrate dissolved in 40 L (liters) of pure water, dilute ammonia water of 344 g of 28% ammonia water dissolved in 20 L of pure water was added while stirring, thereby preparing a zirconia precursor slurry.

Subsequently, a sodium sulfate aqueous solution of 300 g of sodium sulfate dissolved in 5 L of pure water was added to this slurry while stirring. At this time, the addition amount of sodium sulfate was 30% by mass relative to a zirconia conversion value of a zirconium ion in the zirconium salt solution.

Subsequently, this mixture was dried in the air at 130° C. for 24 hours by using a dryer, thereby obtaining a solid.

Subsequently, this solid was pulverized by an automatic mortar and then baked in the air at 500° C. for one hour by using an electric furnace.

Subsequently, this baked material was put into pure water and stirred to make into a slurry form. Thereafter, cleaning was performed using a centrifugal separator, and the added sodium sulfate was sufficiently removed, followed by drying with a dryer, thereby obtaining a zirconia particle having an average primary particle diameter of 4 nm.

(Surface Modification on Zirconia Particle: Fabrication of Surface-Modified Zirconia Particle)

Subsequently, to 10 g of the zirconia particle, 82 g of toluene and 5 g of a methoxy group-containing phenyl silicone resin (KR217, manufactured by Shin-Etsu Chemical Co., Ltd.) were added and mixed, and the mixture was subjected to a surface modification treatment with a bead mill for 6 hours, followed by removing the beads. Subsequently, 3 g of dimethylethoxysilane (L5490, manufactured by Shin-Etsu Chemical Co., Ltd.) was added, and the contents were subjected to surface modification and dispersion treatment under refluxing at 130° C. for 6 hours, thereby preparing a transparent dispersion liquid of zirconia particle having been surface-treated with a surface-modifying material having a phenyl group and a surface-modifying material having a hydrogen group.

(Fabrication of Silicone Resin Composition)

To 50 g of the above-described transparent dispersion liquid of zirconia particle, 7.6 g of, as a phenyl silicone resin, a trade name: OE-6520 (manufactured by Dow Corning Toray Co., Ltd., refractive index: 1.54, compounding ratio of liquid A/liquid B=1/1) (liquid A: 3.8 g, liquid B: 3.8 g) was added, and after stirring, the toluene was removed by drying under reduced pressure, thereby obtaining a silicone resin composition containing a surface-modified zirconia particle, a phenyl silicone resin, and a reaction catalyst (zirconia particle content: 30% by mass).

Incidentally, with respect to OE-6520, not only the presence of a C=C double bond (vinyl group) that is an alkenyl group as well as an Si—H bond (hydrogen group) is already confirmed by means of an NMR analysis, but also the presence of platinum is already confirmed by means of an emission analysis. That is, OE-6520 is a silicone resin of an addition curing type, which is polymerized and cured by means of a hydrosilylation reaction. In consequence, it can be understood that the hydrogen group in the zirconia particle surface-modifying material and the vinyl group in OE-6520 can be bound to each other through a hydrosilylation reaction; and that the platinum catalyst that is a hydrosilylation catalyst contained in OE-6520 is added in a sufficient amount for allowing the silicone resin-forming component in the OE-6520 to undergo hydrosilylation polymerization and curing, and hence, even if the surface-modifying material (in a small amount relative to the silicone resin) is added thereto, it has sufficient amount and effect as the catalyst.

(Fabrication of Silicone Resin Composite)

The above-described silicone resin composition was cured by a thermal treatment at 150° C. for 3 hours, thereby obtaining a silicone resin composite.

The various evaluations as described previously were performed by using this silicone resin composite. Incidentally, in the evaluation of gas permeability, the thickness of the sealing layer was made to be 500 μm.

Example B2

(Fabrication of Titania Particle)

242.1 g of titanium tetrachloride and 111.9 g of tin(IV) chloride pentahydrate were put into 1.5 L (liters) of pure water at 5° C., and the contents were stirred to fabricate a mixed solution.

Subsequently, this mixed solution was heated to adjust the temperature at 25° C., and an ammonium carbonate aqueous solution having a concentration of 10% by mass was added to this mixed solution, thereby adjusting a pH at 1.5. Thereafter, the resultant was aged at 25° C. for 24 hours, and thereafter, an excessive chloride ion was removed by means of ultrafiltration.

Subsequently, water was removed from the mixed solution by using an evaporator, followed by drying to fabricate a titanium oxide particle. The obtained titanium oxide (titania) particle had an average primary particle diameter of 4 nm.

The surface modification was performed in the same manner as that in Example B1, except for using the above-described titania particle and making the content of the metal oxide particle to be 20% by mass, thereby fabricating a transparent dispersion liquid of titania particle having been surface-treated with a surface-modifying material having a phenyl group and a surface-modifying material having a hydrogen group. Subsequently, a silicone resin composition and further a silicone resin composite were fabricated in the same manners as those in Example B1, followed by performing the various evaluations.

Example B3

A transparent dispersion liquid of zirconia particle having been surface-treated with a surface-modifying material having a phenyl group, a surface-modifying material having a hydrogen group, and a surface-modifying material having a vinyl group was fabricated in the same manner as that in Example B1, except for changing the average primary particle diameter of the zirconia particle from 4 nm to 5 nm, changing the surface-modifying material from the dimethylethoxysilane to diethoxymethylsilane (LS880, manufactured by Shin-Etsu Chemical Co., Ltd.), and adding vinyltrimethoxysilane (KBM-1003, manufactured by Shin-Etsu Chemical Co., Ltd.) in a molar ratio of hydrogen group/vinyl group of 4, thereby performing surface modification and dispersion treatment. Subsequently, a silicone resin composition and further a silicone resin composite were fabricated in the same manners as those in Example B1, followed by performing the various evaluations.

Example B4

A transparent dispersion liquid of zirconia particle having been surface-treated with a surface-modifying material having a phenyl group, a surface-modifying material having a hydrogen group, and a surface-modifying material having a vinyl group was fabricated in the same manner as that in Example B1, except for further adding vinyltrimethoxysilane to dimethylethoxysilane as the surface-modifying material in a molar ratio of hydrogen group/vinyl group of 6 thereby performing surface modification and dispersion treatment. Subsequently, a silicone resin composition and further a silicone resin composite were fabricated in the same manners as those in Example B1, followed by performing the various evaluations.

Example B5

A silica particle (SNOWTEX XS, manufactured by Nissan Chemical Industries, Ltd.) having an average primary particle diameter of 6 nm was used as a metal oxide particle.

To 10 g of this silica particle, 82 g of toluene and 5 g of a methoxy group-containing phenyl silicone resin were added and mixed, and the mixture was subjected to a surface modification treatment with a bead mill for 6 hours, followed by removing the beads. Subsequently, 3 g of ethyl dichlorosilane (L5140, manufactured by Shin-Etsu Chemical Co., Ltd.) was added, and the contents were subjected to surface modification and dispersion treatment under refluxing at 130° C. for 6 hours. The obtained dispersion liquid was allowed to pass through a column filled with an alumina gel, thereby removing a chloride ion to an extent of 1 ppm by mass or less. Incidentally, the chlorine amount is one measured by a chlorine ion meter. Thereafter, the surface-modified silica particle was again dispersed in toluene, thereby fabricating a transparent dispersion liquid of silica particle having been surface-treated with a surface-modifying material having a phenyl group and a surface-modifying material having a hydrogen group.

Subsequently, a silicone resin composition and a silicone resin composite were fabricated in the same manners as those in Example B1, followed by performing the various evaluations.

Comparative Example B1

The silicone resin (in which, however, no metal oxide particle was added) used in Example B1 was cured by a thermal treatment at 150° C. for 3 hours, and the cured material was subjected to the same various evaluations as those in Example B1.

Comparative Example B2

A dispersion liquid of zirconia particle having been surface-treated with a surface-modifying material having a phenyl group and a surface-modifying material having a vinyl group was fabricated in the same manner as that in Example B1, except that the dimethylethoxysilane used in the surface modification of a metal oxide particle in Example B1 was changed to vinyltrimethoxysilane. Subsequently, a silicone resin composition and further a silicone resin composite were fabricated in the same manners as those in Example B1, followed by performing the various evaluations.

Comparative Example B3

A dispersion liquid of zirconia particle having been surface-treated with a surface-modifying material having a phenyl group and a surface-modifying material having a hydrogen group was fabricated in the same manner as that in Example B1, except that the average primary particle diameter of the zirconia particle was changed from 4 nm in Example B1 to 20 nm. Subsequently, a silicone resin composition and further a silicone resin composite were fabricated in the same manners as those in Example B1, followed by performing the various evaluations.

Comparative Example B4

A dispersion liquid of zirconia particle having been surface-treated with a surface-modifying material having a phenyl group, a surface-modifying material having a hydrogen group, and a surface-modifying material having a vinyl group was fabricated in the same manner as that in Example B3, except that the compounding ratio of diethoxymethylsilane to vinyltrimethoxysilane used in the surface modification of a metal oxide particle in Example B3 was adjusted to obtain, in a molar ratio, hydrogen group/vinyl group of 0.1. Subsequently, a silicone resin composition and further a silicone resin composite were fabricated in the same manners as those in Example B1, followed by performing the various evaluations.

Comparative Example B5

A dispersion liquid of zirconia particle having been surface-treated with a surface-modifying material having a phenyl group and a surface-modifying material having a carbon chain was fabricated in the same manner as that in Example B1, except that the dimethylethoxysilane used in the surface modification of a metal oxide particle in Example B1 was changed to dodecyltrimethoxysilane. Subsequently, a silicone resin composition and further a silicone resin composite were fabricated in the same manners as those in Example B1, followed by performing the various evaluations.

Comparative Example B6

A dispersion liquid of zirconia particle having been surface-treated with a surface-modifying material having a phenyl group and a surface-modifying material having a hydrogen group was fabricated in the same manner as that in Example B1, except that the average primary particle diameter of the zirconia particle was changed from 4 nm in Example B1 to 2 nm. Subsequently, a silicone resin composition and further a silicone resin composite were fabricated in the same manners as those in Example B1, followed by performing the various evaluations.

Details and evaluation results of the silicone resin composites in the foregoing respective Examples and Comparative Examples are summarizingly shown in Tables 3 and 4.

TABLE 3

| | Metal oxide particle | Primary particle diameter [nm] | Surface-modifying material | Hydrogen group/ vinyl group [molar ratio] | Content of metal oxide particle [% by mass] | Thickness of sealing layer [μm] |
|---|---|---|---|---|---|---|
| Example B1 | $ZrO_2$ | 4 | Methoxy group-containing phenyl silicone resin Dimethylethoxysilane | — | 30 | 500 |
| Example B2 | $TiO_2$ | 4 | Methoxy group-containing phenyl silicone resin Dimethylethoxysilane | — | 20 | 500 |
| Example B3 | $ZrO_2$ | 5 | Methoxy group-containing phenyl silicone resin Diethoxymethylsilane Vinyltrimethoxysilane | 4 | 30 | 500 |
| Example B4 | $ZrO_2$ | 4 | Methoxy group-containing phenyl silicone resin Dimethylethoxysilane Vinyltrimethoxysilane | 6 | 30 | 500 |
| Example B5 | $SiO_2$ | 6 | Methoxy group-containing phenyl silicone resin Ethyldichlorosilane | — | 20 | 500 |
| Comparative Example B1 | — | — | — | — | 0 | 500 |
| Comparative Example B2 | $ZrO_2$ | 4 | Methoxy group-containing phenyl silicone resin Vinyltrimethoxysilane | — | 30 | 500 |
| Comparative Example B3 | $ZrO_2$ | 20 | Methoxy group-containing phenyl silicone resin Dimethylethoxysilane | — | 30 | 500 |
| Comparative Example B4 | $ZrO_2$ | 5 | Methoxy group-containing phenyl silicone resin Diethoxymethylsilane Vinyltrimethoxysilane | 0.1 | 30 | 500 |
| Comparative Example B5 | $ZrO_2$ | 4 | Methoxy group-containing phenyl silicone resin Dodecyltrimethoxysilane | — | 30 | 500 |
| Comparative Example B6 | $ZrO_2$ | 2 | Methoxy group-containing phenyl silicone resin Dimethylethoxysilane | — | 30 | 500 |

TABLE 4

| | Transmittance of silicone resin composite [%] | Heat resistance | Gas barrier properties (blackening time [h]) | Hardness of silicone resin composite |
|---|---|---|---|---|
| Example B1 | 81 | A | 10 | A |
| Example B2 | 74 | A | 8 | A |
| Example B3 | 83 | A | 12 | A |
| Example B4 | 77 | A | 10 | A |
| Example B5 | 67 | A | 8 | A |
| Comparative Example B1 | 97 | A | 6 | A |
| Comparative Example B2 | 90 | C | 8 | A |
| Comparative Example B3 | 26 | A | 6 | A |
| Comparative Example B4 | 78 | C | 8 | A |
| Comparative Example B5 | 35 | C | 6 | A |
| Comparative Example B6 | 91 | A | 4 | B |

In Examples B1 to B5, since the metal oxide particle having an average primary particle diameter of 3 nm or more and 10 nm or less was used, and this particle was surface-modified with a surface-modifying material having a phenyl group and a hydrogen group, the light transmittance, the heat resistance, and the gas barrier properties in the silicone resin composite fabricated by using the foregoing surface-modified metal oxide particle material could be kept in a good state.

In particular, with respect to the gas barrier properties, it is shown that the gas barrier properties were distinctly enhanced relative to Comparative Example B1 that is a silicone resin simple substance as a standard. It may be considered that this is an effect to be brought due to the fact that the hydrogen group in the surface-modifying material on the basis of dimethylethoxysilane, diethoxymethylsilane, and ethyl dichlorosilane used as the surface-modifying material and the vinyl group in OE-6520 that is the matrix silicone resin raw material underwent a crosslinking reaction through a hydrosilylation reaction at the time of curing of the resin composition and bound to each other, whereby the metal oxide particle and the matrix silicone resin were integrated with each other.

In addition, among these Examples, Examples B3 and B4 were especially high in gas barrier properties. It may be considered that this is an effect to be brought due to the fact that not only the hydrogen group in the surface-modifying material and the vinyl group in OE-6520 that is the matrix silicone resin raw material underwent a crosslinking reaction through a hydrosilylation reaction and bound to each other, but also the vinyl group in the surface-modifying material on the basis of vinyltrimethoxysilane used as the surface-modifying material and the hydrogen group in OE-6520 that is the matrix silicone resin raw material underwent a crosslinking reaction and bound to each other, whereby the metal oxide particle and the matrix silicone resin were more firmly integrated with each other.

Meanwhile, with respect to Comparative Example B2, yellowing was caused after the evaluation test of heat resistance. It may be considered that this is caused due to the fact that since vinyltrimethoxysilane but not dimethylethoxysilane was used as the surface-modifying material, the unreacted vinyl group excessively remained in the silicone resin composite. Incidentally, though the gas barrier properties were enhanced as compared with the silicone resin simple substance, it may be considered that this is an effect to be brought due to the fact that the vinyl group in the surface-modifying material and the hydrogen group in OE-6520 that is the matrix silicone resin raw material underwent a crosslinking reaction through a hydrosilylation reaction at the time of curing of the resin composition.

In addition, with respect to Comparative Example B3, the transmittance of light was lowered. It may be considered that this was caused due to the fact that the particle diameter of metal oxide was large, so that scattering of light was generated.

In addition, with respect to Comparative Example B4, yellowing was caused after the evaluation test of heat resistance. It may be considered that this is caused due to the fact that since a large amount of vinyltrimethoxysilane was used as the surface-modifying material together with diethoxymethylsilane, the unreacted vinyl group excessively remained in the silicone resin composite. Incidentally, though the gas barrier properties were enhanced as compared with the silicone resin simple substance, it may be considered that this is a combination of an effect to be brought due to the fact that the hydrogen group in the surface-modifying material on the basis of diethoxymethylsilane and the vinyl group in OE-6520 that is the matrix silicone resin raw material underwent crosslinking and polymerization through a hydrosilylation reaction at the time of curing of the resin composition and an effect to be brought due to the fact that the vinyl group in the surface-modifying material and the hydrogen group in OE-6520 that is the matrix silicone resin raw material underwent a crosslinking reaction through a hydrosilylation reaction at the time of curing of the resin composition.

In addition, with respect to Comparative Example B5, yellowing was caused after the evaluation test of heat resistance. It may be considered that this is caused due to the fact that since dodecyltrimethoxysilane but not dimethylethoxysilane was used as the surface-modifying material, the carbon chain portion of dodecyltrimethoxysilane was thermally denatured.

In addition, with respect to Comparative Example 6, the gas permeability was high, so that sufficient gas barrier properties were not obtained. It may be considered that this was caused due to the fact that the particle diameter of metal oxide was small, and the viscosity of silicone resin composition was high, and therefore, the workability was poor, and sealing itself was not sufficiently performed.

INDUSTRIAL APPLICABILITY

The present invention can be utilized as not only a sealing material of semiconductor light emitting elements (LED, etc.) but also materials, members, and the like in other various industrial fields.

The invention claimed is:
1. A surface-modified metal oxide particle material obtained by performing surface modification on a metal oxide particle having an average primary particle diameter of 3 nm or more and 10 nm or less with a surface-modifying material having at least a phenyl group and a group capable of undergoing a crosslinking reaction with a functional group in a silicone resin-forming component,
  wherein the group capable of undergoing a crosslinking reaction with a functional group in a silicone resin-forming component is a hydrogen atom,
  wherein the surface-modifying material is a combination of a surface-modifying material containing a phenyl group and a surface-modifying material containing a hydrogen atom,
  the surface-modifying material containing a phenyl group is one or more kinds selected from the materials having a structure represented by the following formulae (1), (2) and silicone materials having a resin structure (three-dimensional network structure) containing a phenyl group and an alkoxy group,

$$(C_6H_5)_n SiX_{4-n} \quad \text{formula (1):}$$

wherein, n is an integer of from 1 to 3, X is selected from a methoxy group, an ethoxy group, a hydroxyl group, a halogen atom, and a carboxy group; and when (4−n) is 2 or more, each X may be the same as or different from every other X, formula (2):

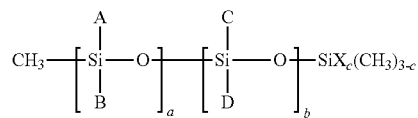

wherein a is an integer of from 1 to 100; b is an integer of from 0 to 100; and c is an integer of from 1 to 3; and wherein each of A, B, C and D is one or two or more members selected from the group consisting of a phenyl group and an alkyl group having from 1 to 6 carbon atoms, and at least any one of A and B is a phenyl group; and wherein all of A, B, C, and D may be a phenyl group; and wherein each of the sites constituted of Si.A.B.O and the sites constituted of Si.C.D.O is arbitrary with respect to the position and arrangement and is of a random polymer type; and wherein X is selected from the group consisting of a methoxy group, an ethoxy group, a hydroxyl group, a halogen atom, and a carboxy group, and when c is 2 or more, each X may be the same of different from every other X, and the surface-modifying material containing a hydrogen group is one or more kinds selected from the group consisting of triethoxysilane, dimethylethoxysilane, diethoxymethylsilane, dimethylchlorosilane and ethyldichlorosilane.

2. A dispersion liquid including the surface-modified metal oxide particle material according to claim 1.

3. A silicone resin composition including the surface-modified metal oxide particle material according to claim 1 and a silicone resin-forming component containing at least one member from the group consisting of phenyl silicone resin-forming component and a methyl phenyl silicone resin-forming component, the silicone resin-forming component having at least one member selected from the group consisting of an alkenyl group and an alkynyl group.

4. The silicone resin composition according to claim 3, wherein the metal oxide particle is contained in an amount of 5% by mass or more.

5. The silicone resin composition according to claim 3, further including a hydrosilylation catalyst.

6. A silicone resin composite obtained by curing the silicone resin composition according to claim 3.

7. An optical semiconductor light emitting device comprising a semiconductor light emitting element sealed with a sealing material, wherein the sealing material is composed of the silicone resin composite according to claim 6, and a sealing layer made of the sealing material has a thickness of 50 μm or more.

8. A light fitting comprising the optical semiconductor light emitting device according to claim 7.

9. A liquid crystal imaging device comprising the optical semiconductor light emitting device according to claim 7.

* * * * *